United States Patent [19]

Satoh et al.

[11] Patent Number: 5,448,733
[45] Date of Patent: Sep. 5, 1995

[54] DATA SEARCH AND COMPRESSION DEVICE AND METHOD FOR SEARCHING AND COMPRESSING REPEATING DATA

[75] Inventors: Akashi Satoh, Yamato; Hideto Niijima, Tokyo, both of Japan

[73] Assignee: International Business Machines Corp., Armonk, N.Y.

[21] Appl. No.: 275,471

[22] Filed: Jul. 14, 1994

[30] Foreign Application Priority Data

Jul. 16, 1993 [JP] Japan ............................... 5-176737
Dec. 20, 1993 [JP] Japan ............................... 5-319944

[51] Int. Cl.$^6$ ............................................. G06F 17/30
[52] U.S. Cl. ................................... 395/600; 364/964; 364/963; 364/DIG. 2
[58] Field of Search ........................ 395/600, 425, 550

[56] References Cited

U.S. PATENT DOCUMENTS

| | | | |
|---|---|---|---|
| 4,152,762 | 5/1979 | Bird et al. ........................... | 395/425 |
| 4,450,520 | 5/1984 | Hollaar et al. ..................... | 395/550 |
| 4,575,818 | 3/1986 | Almy et al. ......................... | 365/49 |
| 4,916,655 | 4/1990 | Oshone et al. ..................... | 395/600 |
| 5,212,697 | 5/1993 | Morita ................................ | 371/68.1 |
| 5,319,762 | 6/1994 | Mayer ................................. | 395/425 |

OTHER PUBLICATIONS

G. Salton "Automatic Text Processing" Addison-Wesley p. 104, 1989.
L. Hollaar "Special-Purpose Hardware for Information Retrieval" in W. Frakes et al. ed. Information Retrieval: Data Structures and Algorithms Prentice-Hall pp. 443-458, 1992.

Primary Examiner—Thomas G. Black
Assistant Examiner—Peter Y. Wang
Attorney, Agent, or Firm—Thornton & Thornton; Mark Chadurjian

[57] ABSTRACT

This is a variable length data search apparatus which uses a latch, added to each word of a cell array. In this apparatus, the search operation is self controlled by using the previous matching signals stored in the latches. A character string (ABCA), from a data string (BABCABB . . . ), is stored, in order, in an associative memory containing, e.g., six rows having addresses 1 to 6, and the first character of the data string is sent to a buffer and a comparison is made. This sequence is repeated for each character but now the comparison is made only at the cell rows addresses which are adjacent the cell rows, which matched the previous character. This means that even if the length of the search character string is a variable length, only the number of times the comparison operation is repeated varies and this permits the search to be completed in an extremely short time as compared to the prior art. A data compression circuit based on the LZ1 algorithm is also disclosed and uses; a data input control circuit, the variable length search apparatus disclosed above; a write address controller, and address register; a garbage address controller; a matching length counter and a compressed data output circuit.

12 Claims, 17 Drawing Sheets

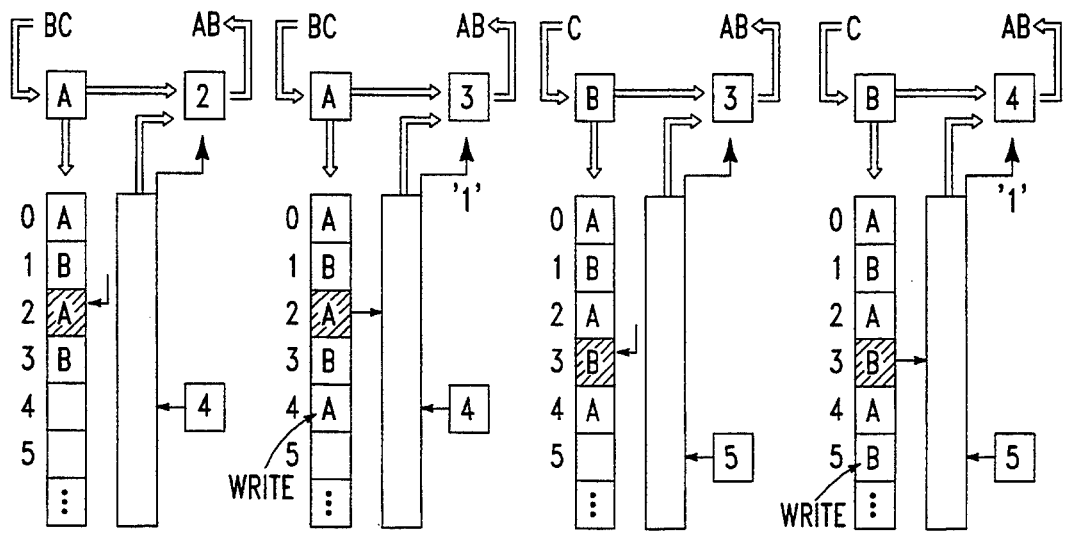
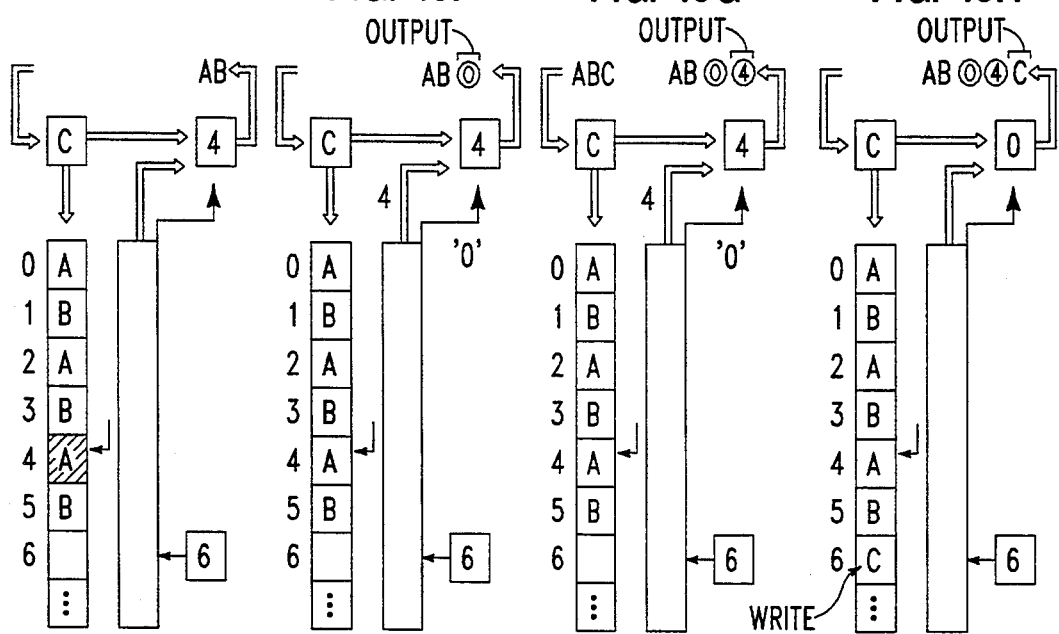

DATA SEARCH AND COMPRESSION DEVICE AND METHOD FOR SEARCHING AND COMPRESSING REPEATING DATA

FIELD OF THE INVENTION

The present invention relates to a data search and compression device, and in particular, to one which not only searches data, in the form of a character string or the like, but one in which repeating data is searched for and compressed.

BACKGROUND OF THE INVENTION

In computers, searches for a predetermined piece of or unit of data, from a data base in the form of a character string or the like, are frequent. Such a search is often executed by software, but, for shorter processing times, it is can be accomplished by hardware. A conventional search circuit for accomplishing this is illustrated in FIG. 17A.

The search circuit 500 illustrated in FIG. 17A is comprised of by a plurality of registers 502, a shift register 504, a plurality of comparators 506, and an AND circuit 508.

Retrieval data So through Sn are stored in the plurality of registers 502. The shift register 504 holds a portion of data to be searched Do . . . . The comparators 506 compare the data held in the registers 502 and the data held in the shift register 504 and when a match is obtained a high-level comparing signal is fed from the respective comparators 506 to the AND circuit 508.

In conventional associative memory, i.e.,content addressable memory (CAM) when a data set is designated, the address of the storage region in which the data is stored is the output. A data search device using a conventionally-proposed associative memory (e.g., Japanese Patent Application Laid-Open No. 2-66671), is illustrated conceptually in FIG. 17B, as circuit 510. Here the registers 502 and comparators 506 of FIG. 17A are replaced by associative memory portions 514.

The associative memory portions 514, comprised of comparing circuits, store data of a predetermined length, and compares the stored data with input data. A search is effected by storing data in the associative memory portion 514 and comparing it to input data held in the shift register 504, and the output fed to a precharged match line 516 which is set low, i.e., discharged, when no match is found.

Accordingly, the match line 516 is maintained high (i.e., charged) only when the comparison results of all of the associative memory portions 514 are "matching". Therefore, a high level on the match line 516 is determinative of the existence of a match.

However, when data of an undefined length (hereinafter, "variable-length data") is searched for, it is necessary to correspond the length of data which can be stored by the shift register 504 to the maximum length of the search data, and to correspond the number of associative memory portions 514 to the maximum length of the search data. However, when the search data is short, all the circuits are not required and the excess circuits uselessly consume electric power.

In order to prevent the comparison outputs from the unnecessary associative memory circuits from influencing the results of the search circuit 510, it is necessary, for example, to add circuits effecting "Don't Care" (DC) processing in which either "matching" comparison results are compulsorily provided from the unnecessary associative memory circuits, or in which the comparison outputs are ignored and the number of relevant associative memory circuits is varied in accordance with the length of the search data. For associative memory devices having such a DC processing function, it is difficult to design an integrated circuit structure having a high degree of integration, and as a result, it is difficult for the apparatus to be made compact.

Accordingly, various drawbacks arise when a search for variable-length search data is to be effected by using associative memories.

Moreover, when a search for fixed-length data of a set length is undertaken, the search time increases in proportion to the length of the data to be searched.

Now however with multimedia technology there is a need to handle large amounts of various data such as image data, voice data, document data, programs and the like for various systems. It is very advantageous to store large amounts of data and to transmit the data after compression. Consequently, the needed importance of data compression techniques has rapidly increased.

Data compression techniques can be roughly classified into two types: lossy compression and lossless compression. Although the compression rate in lossy compression is high, information is lost in the processes of compressing data and restoring the compressed data. Therefore, lossy compression can only be applied to specific fields. On the other hand, although the compression rate of lossless compression is low, information is not lost in the processes of data compression and restoration of the compressed data. Because the restored data completely matches the original data before compression, lossless compression has a wide range of applicability.

In 1977, Lempel and Ziv proposed a universal lossless compression algorithm LZ77 based on the dictionary technique. The compression rate of LZ77 is high as compared with entropy codes such as the well-known Huffman code. LZ77 basically searches for repeating data, which is included among original data, by replacing the repeating data by another code and compressing it by eliminating redundancy. In LZ77, it is relatively easy to restore the compressed data, however, because the repeating data is of undefined variable, much work is required in searching for the repeating data when compressed.

Other software techniques also use data compression. In these techniques, original data is converted into tree structure data, and a search for the repeating data is made.

However, because the algorithm for this approach (converting data into tree structure data) is extremely complicated, much time is required for processing and a large load is placed on the CPU.

To avoid these drawbacks, it has been proposed to replace these software techniques by hardware. However, this cannot be realized easily for the time required for compression is not uniform because the tree structures differ in that they are based on the contents of the original data.

SUMMARY OF THE INVENTION

To avoid the problems of the prior art, the present invention was developed and provides a high speed data search device.

It is therefore object of the present invention is to provide a data search and data compression device and a method which can effect a data search and data compression at high speed.

To achieve the these and other objects, the present invention provides: a plurality of storing means, each for storing a unit of data of a predetermined bit length, and having a corresponding plurality of comparing means, for providing a matching signal when the stored unit of data matches an input unit of data; and control means for fetching a block of data from a data stream and feeding it to each of the plurality of comparing means.

The present invention may be structured to store the data to be searched, in either ascending or descending order of addresses, with the control means fetching the unit of data while moving a position, from which the unit of data is fetched, per the predetermined bit length from a beginning to an end of the search data, and providing the fetched unit of data only to a comparing means adjacent to the comparing means which has previously found a match.

The data compression device relating to the invention comprises: a storing device having a plurality of storing means for storing a unit of data from a data base or data string and a corresponding number of comparing means, for putting out a matching signal when the unit of data, stored in the storing means, corresponds to a received unit of data; and control means fetching a specific unit of data from a data string and sending the fetched specific unit of data to each of the plurality of comparing means such that the fetched unit of data is stored in either ascending or descending order of addresses given to the storing means, and units of fetched data is sent only to the comparing means adjacent to the comparing means which has provided a matching signal. When a matching signal has not been provided, the fetched unit of data is compressed and stored and thereafter, when a subsequent unit of data adjacent to the fetched unit of data is fetched from the string of data and sent to each of the comparing means, and it is replaced with a predetermined code as compressed data, and is stored and an additional unit of data, adjacent to the fetched unit of data, is fetched and sent to each of the comparing means, the control means repeating aforementioned operations so as to compress the original data into compressed data, and putting out the compressed data.

The present invention teaches a data compression device which comprises: a plurality of storing means, each os which stores a unit of data, a corresponding number of comparing means, for putting out a matching signal when the stored unit of data, in a respective storing means, corresponds to a received unit of data; and control means fetching a specific unit of data from original data and sending the specific unit of data to each of the comparing means, and, if a match is found, will store the fetched unit of data, in the storing means, in either ascending order or descending order of address and thereafter fetching an additional unit of data adjacent to the previously fetched unit of data and sending it to the next comparing means adjacent to the comparing means which has previously found a match and when no match was found, the fetched unit of data is compressed and stored, in the storing means, and thereafter, a new unit of data adjacent to the previously fetched unit of data, is fetched and sent to each of the comparing means, and repeating the aforementioned operations so as to compress the original data into compressed data, and putting out the compressed data.

The present invention also teaches that the control means can be provided with a counting means for counting a number of times the matching signal is put out from a comparing means, and a predetermined code may be formed by using the number of times counted by the counting means and an address of the storing means corresponding to the comparing means which put out the matching signal.

Still further the present invention provides holding means, which correspond to the storing means of the storing device, for holding information expressing whether the fetched unit of data has been stored in the storing means; and invalidation control means for invalidating, on the basis of information held by the holding means, the matching signal sent from the comparing means when the fetched unit of data has not been stored in the storing means.

The present invention also teaches a data compression method using a plurality of storing means for the storing of data of a predetermined bit length, together with a corresponding number of comparing means for sending a matching signal when data stored, in the storing means, corresponds to received data. The data compression method comprising the steps of: fetching a specific unit of data from an original data string, formed of a predetermined number of units of data, and sending the specific unit of data to each of the plurality of comparing means of the storing device, and thereafter, when a match has been found storing the fetched unit of data, in the storing means, and thereafter fetching a new unit of data adjacent to the previously fetched unit of data, and sending it to a comparing means adjacent to the comparing means which has found a match and when a match has not been found, the fetched unit of data is compressed and stored, in the storing means, and thereafter, fetching a new unit of data, adjacent to the previously fetched unit of data, and sending the newly fetched data to each of the comparing means, and replacing it with a predetermined code as compressed data, and storing it, the storing means, and fetching a new unit of data adjacent to the unit of data, previously fetched and sent to each of the comparing means, and repeating the aforementioned operations so as to compress the original data into compressed data, and putting out the compressed data.

These and other objects, features, and advantages of the invention will be apparent from the following more particular description of the preferred embodiment of the invention as illustrated in the accompanying drawings.

BRIEF DESCRIPTION OF THE DRAWINGS

FIGS. 13A through 13H are conceptual views for further explaining compression operations in the circuit of FIG. 10;

DESCRIPTION OF THE PREFERRED EMBODIMENT

Figure 1:
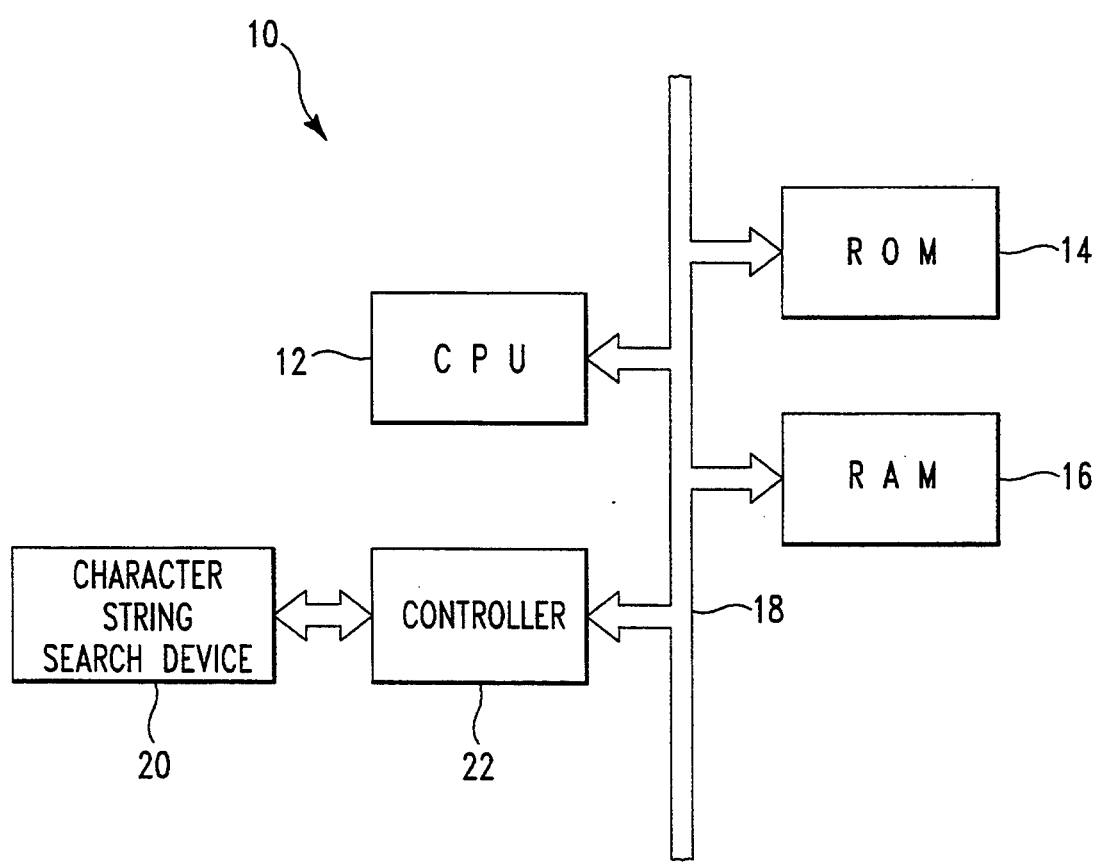
FIG. 1 is a block diagram illustrating a schematic structure of a microcomputer.

In the present invention, a storing device is equipped with a plurality of storing means, for storing a unit of data, and a plurality of comparing means which output a matching signal when a stored unit of data and an input unit of data match. In the storing device, the data to be searched for, is divided into units of data or bits and stored respectively, as such, in a predetermined order in the plurality of storing means. The length of the specific fetched unit of data (bit length) can be 8 bits when, for example, the search data represents a character in ASCII code or an ISO code.

The length of the unit of data can be 16 bits for a Japanese character, including kanji.

A specific unit of data to be searched, say eight bits, (hereinafter referred to as the search data) is fetched from a data string, to be searched, and is sent to each of the plurality of comparing means of the storing device. Thereafter, operations of moving the position at which the unit of data is fetched from the search data, fetching the unit of data, and sending the fetched unit of data to the comparing means are repeated.

Accordingly, all eight bits of the fetched data and the unit of data, stored in the storing means, are compared in parallel in each of the comparing means. The search for the search data is thereby completed.

Therefore, the processing time necessary for searching (specifically, the number of times that the comparison operation is repeated) varies in accordance with the length of the search data. As compared with a conventional case in which the number of times the comparison operation is repeated varies in accordance with the length of the data to be searched, a data search can be effected in an extremely short time, especially in cases in which the length of the data to be searched is very long.

Further, even if the search data is variable-length data of an undefined length, only the number of times that the unit of data is sent to the comparing means varies in accordance with the length of the search data. There is no need to vary the circuit structure to match the maximum value of the length of the search data.

Moreover, in cases in which the length of the search data is shorter than the maximum value, the conventional art requires use of unnecessary comparators, the number of which varies in accordance with the length of the search data, or the use of associative memory cells or RAM cells to which are added circuits effecting DC (Don't Care) processing for invalidating comparison results of an associative memory portion (the comparing means in the present invention).

However, in the present invention, even if the number of search data varies, only the number of times the unit of data is sent to the comparing means varies. Therefore, there is no need for associative memory cells or RAM cells to which circuits which effect DC processing are added.

Accordingly, the storing device of the data search device can be structured by using ordinary associative memory cells, RAM cells or the like having a high degree of integration, and the device can be made more compact.

The present invention will now be described in detail with reference to the drawings.

A portion of a microcomputer 10, to which the present invention is applied, is illustrated in FIG. 1. The microcomputer 10 includes a CPU 12, a ROM 14, a RAM 16 and a controller 22 all connected together, via a bus 18, handling addresses, data control signals and the like. Further, a character string search device 20, relating to the present invention, is connected to the bus 18 via a controller 22.

Figure 2:
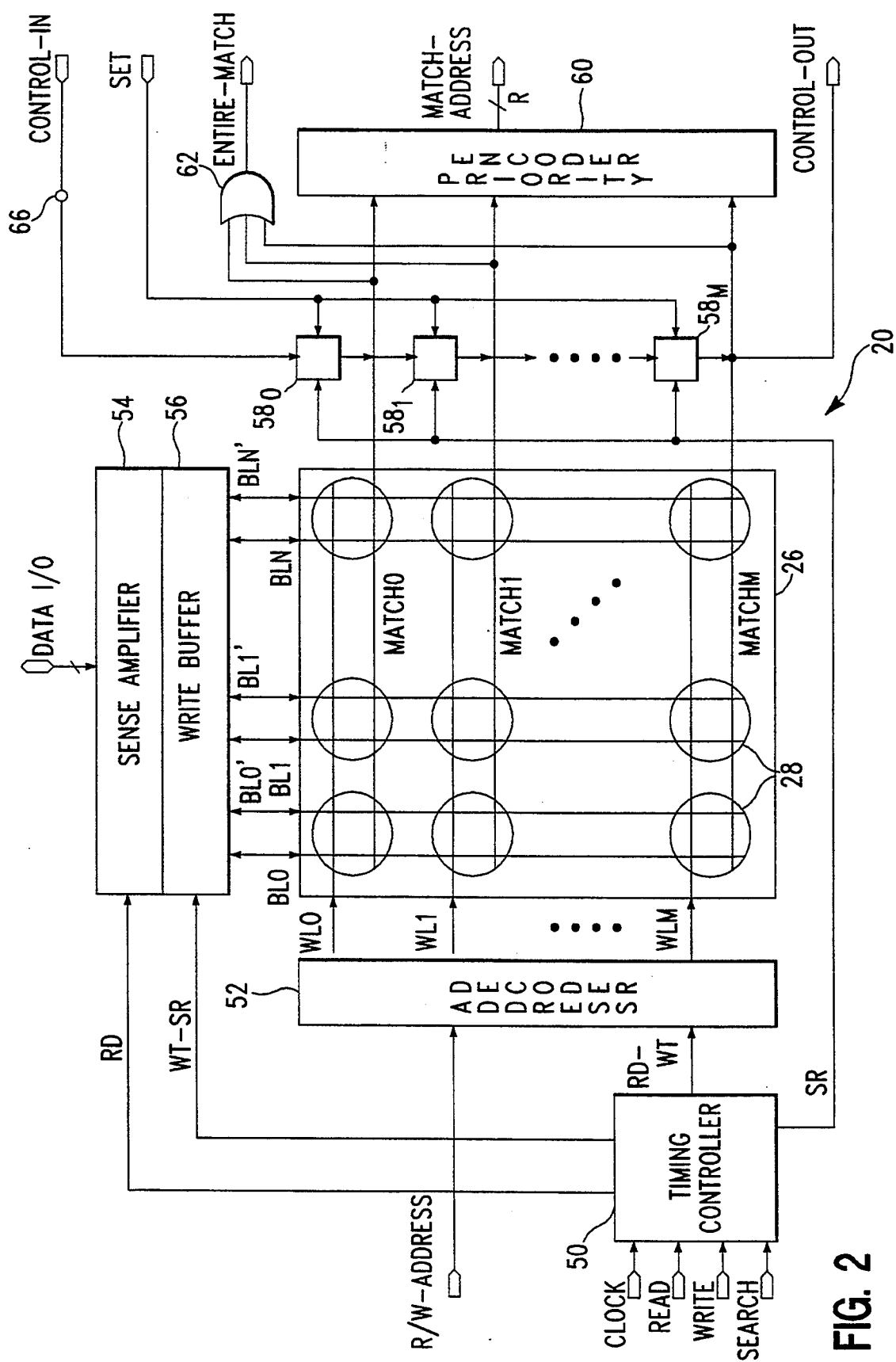
FIG. 2 is a schematic block diagram of the character string search device of FIG. 1.

As illustrated in FIG. 2, the character string search device 20 includes a timing controller 50, an address decoder 52 and an associative memory cell array 26 in which a plurality of associative memory cells (i.e., unit cells) 28, are arranged in matrix form. A plurality (M+1) of word lines WL0 through WLM, a plurality (M+1) of match lines MATCH0 through MATCHM, and a plurality (N+1) of pairs of bit lines BL0,BL0' through BLN,BLN' are respectively arranged in matrix forms in the associative memory cell array 26. Each of the associative memory cells 28 is connected to a respective one of the word lines WL0 through WLM, a respective one of the match lines MATCH0 through MATCHM, and a respective one of the bit line pairs BL0, BL0' through BLN, BLN'.

Figure 3:
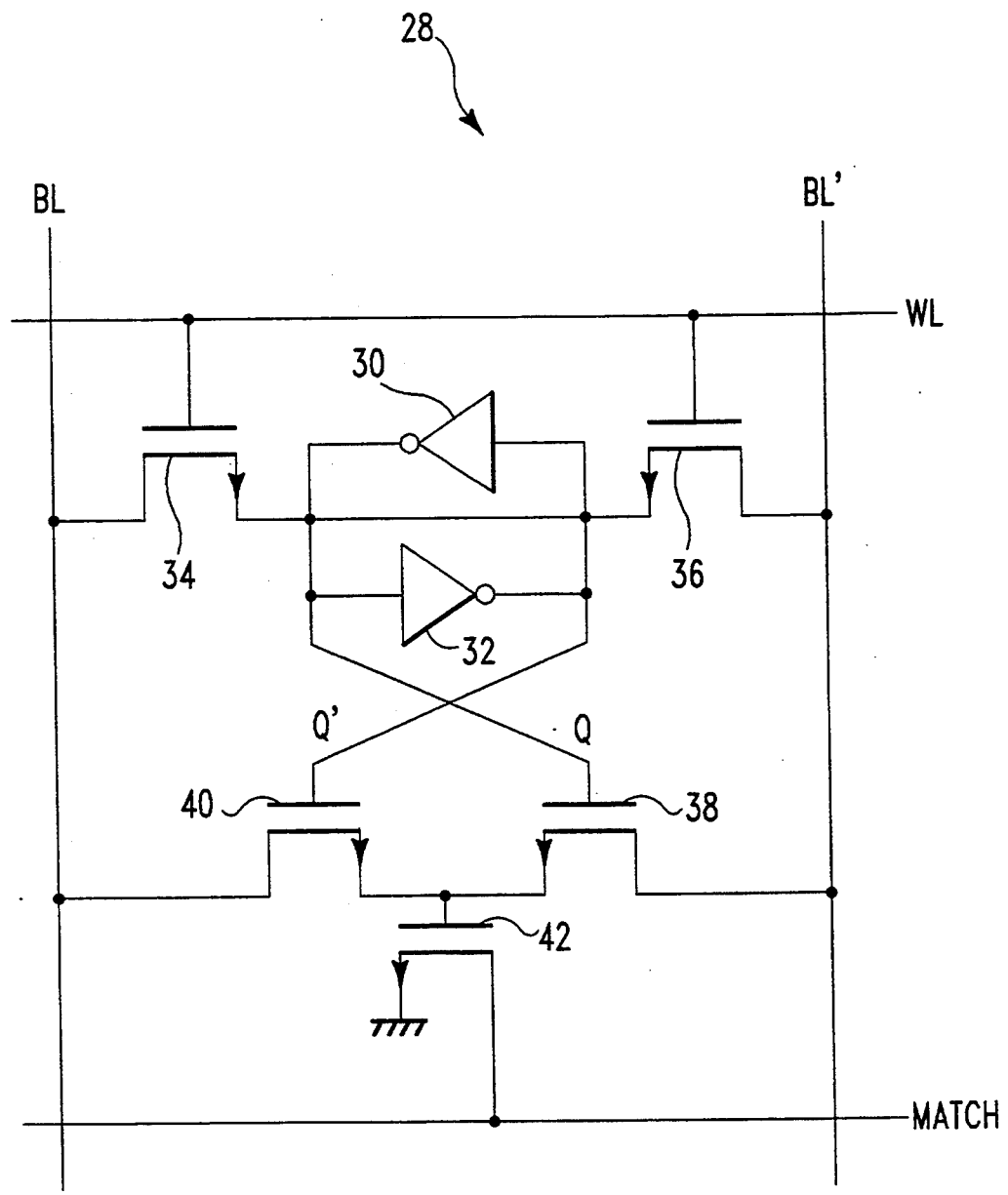
FIG. 3 is a schematic of a unit cell of an associative memory.

The associative memory cell 28, shown in greater detail in FIG. 3, includes two NOT circuits 30, 32 whose respective input terminals and respective output terminal are connected together forming a SRAM type storage circuit which stores data. The output terminal of the NOT circuit 30 is connected to the source of an N channel type MOSFET 34, and the output terminal of the NOT circuit 32 is similarly connected to the source of an N channel type MOSFET 36. The gates of the MOSFETs 34, 36 are respectively connected to the word line WL.

Further, the drains of the MOSFETs 34, 36 are respectively connected to the bit lines BL,BL'. When data D, 1 bit in length, is written into the associative memory cell 28 (referred to hereinafter as the "write" mode), the word line WL is driven high, the bit line BL becomes goes to a level corresponding to the level of data D (high when D is "1", and low when D is "0"), and the bit line BL' goes to the inverse level. When word line WL goes high, the MOSFETs 34, 36 are turned on, and the data supplied via the bit line pair BL or BL' is held in the loop of the NOT circuits 30, 32, i.e., the data is stored in the associative memory cell 28 is and the cell 28 can be read (hereinafter, the "read" mode).

The output of the NOT circuit 30 applies the stored data Q to the gate of the MOSFET 38, and the output of the NOT circuit 32 applies the stored data Q' (the data D inverted) to the gate of the MOSFET 40. The drains of the MOSFETs 38, 40 are respectively connected to the bit lines BL', BL, and the sources thereof are connected to the gate of a MOSFET 42 whose drain is connected to the match line MATCH, and whose source is grounded.

Thus the NOT circuits 30, 32 of each respective associative memory cell 28 of the cells forming a single associative memory cell correspond to the storing means of the present invention and the MOSFETs 38, 40, 42 of the respective memory cell 28 correspond to the comparing means of the present invention.

Returning now to FIG. 2, it should be understood that in the present invention, the number of associative memory cells 28 which are connected to the same word line and match line are equal to the number of bits expressing one character forming the character string to be searched (e.g., 8 bits for ASCII code, ISO code, or the like) and is hereinafter referred to as an associative memory cell row. Further, in the associative memory cell array 26, an address is given to each associative memory cell row.

The character string search device 20 is equipped with a timing controller 50 driven by controller 22 which provides CLOCK, READ, WRITE, and SEARCH signals to the timing controller 50 and an R/W/ address to the address decoder 52 and a data I/O node to a sense amplifier 52 and write buffer 56. Operational modes of the character string search device 20 are the "read" mode in which data stored in the associative memory cell array 26 is read, the "write" mode in which data is written into the associative memory cell array 26, and a "search" mode in which a search with respect to data stored in the associative memory cell array 26 is effected.

The inputs CLOCK, READ, WRITE, and SEARCH, are coupled to a suitable, well known, clock source that will in conjunction with the timing controller 50 provide four distinct clock signals (clock signal RD, clock signal WT-SR, clock signal RD-WT, clock signal SR) as necessary for the three operational modes. The clock signal RD-WT is used in conjunction with a "read" and "write" sequence from controller 22 and is fed to an address decoder 52 from the timing controller 50. The address decoder 52 drives the word lines WL0 through WLM such that the word line of the associative memory cell row corresponding to the designated address becomes high.

A sense amplifier 54 and a write buffer 56 are also connected to the timing controller 50. During the "read" cycle, the clock signal RD is fed to the sense amplifier 54 so as to operate the sense amplifier 54 and during the "write" and "search" cycles, the clock signal WT-SR is fed to the write buffer 56 so as to operate the write buffer 56. The bit line pairs BL0,BL0' through BLN,BLN' are respectively connected to the sense amplifier 54 and the write buffer 56.

During "read", the sense amplifier 54 amplifies the levels of the bit line pairs BL0,BL0' through BLN,BLN', and feeds them to the controller 22 via DATA I/O 54a. During "write" and "search", the write buffer 56 drives, i.e., varies, the levels of the bit line pairs BL0,BL0' through BLN,BLN' in accordance with data received from the controller 22 and stored in the buffer. During "search", the address decoder 52 is not operated and all of the word lines WL0 through WLM become low, as described above and search data is not written into the associative memory cells 28.

A plurality (M+1) of precharge controllers $58_0$ through $58_M$ are respectively connected to the timing controller 50 via control-in node 66. During "search" operation, the clock signal SR is fed to the precharge controllers $58_0$ through $58_M$ so that they are respectively operated. The precharge controller $58_0$ is connected between the controller 22, via a terminal 66 and the match line MATCH0.

The precharge controller $58_1$ is connected between match lines MATCH0 and MATCH1. Similarly the other precharge controllers are connected, between adjacent match lines with precharge controller $58_m$ being connected to match line MATCHM and to CONTROL-OUT.

Figure 4:
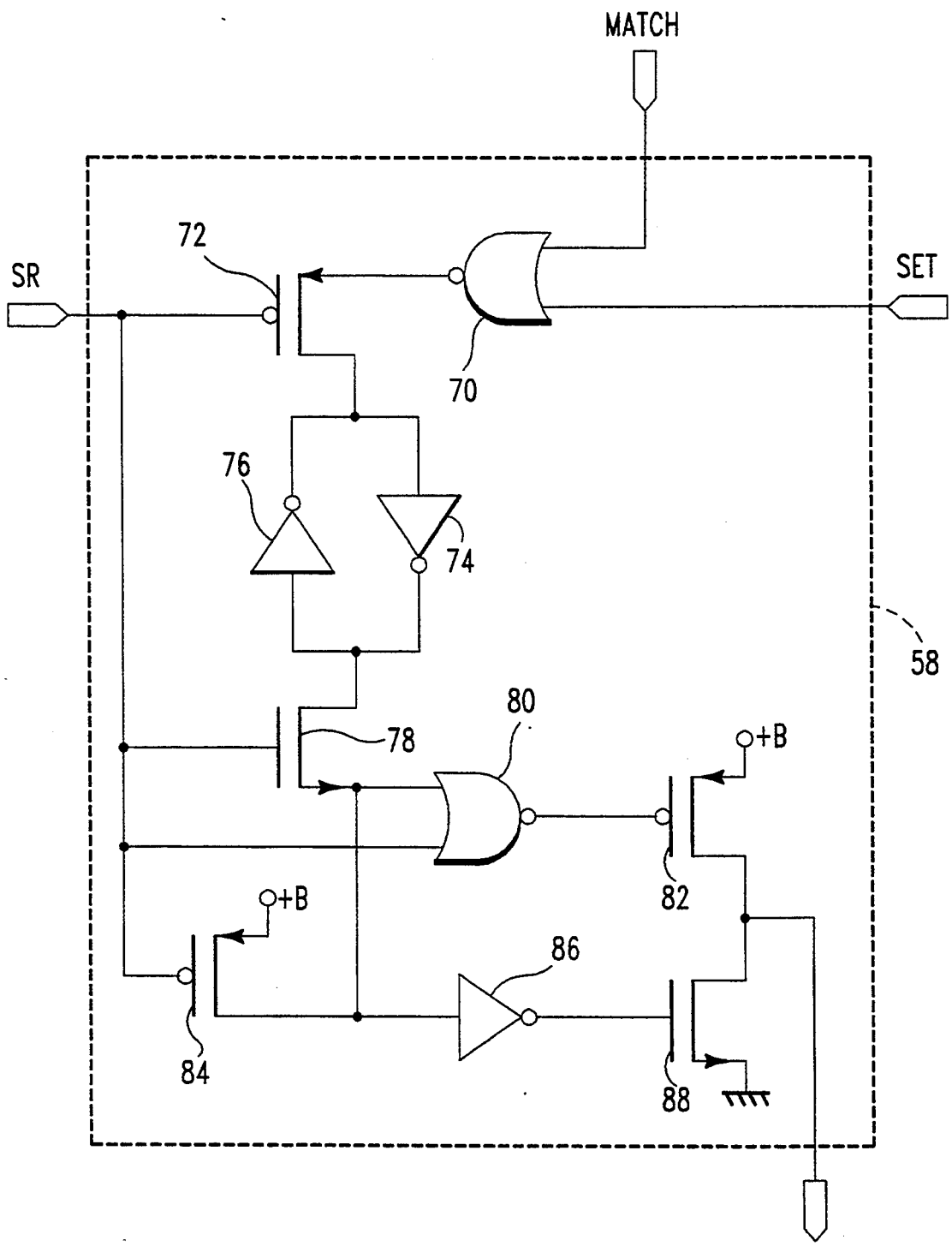
FIG. 4 is a schematic circuit diagram structure of a precharge circuit.

As illustrated in FIG. 4, each precharge controller 58 is positioned between upper and lower match lines. If for example the controller were precharge controller $58_1$ these match lines would be match lines MATCH0 and MATCH1. Each controller 58 is equipped with a NOR circuit 70 which has one of its input terminals connected to the match line of the previous stage, for example, match line MATCH0 (for precharge controller $58_1$). In the case of the initial precharge controller $58_0$, this input, of the NOR circuit 70, would be connected to the controller 22 via the terminal 66. The other input terminal of the NOR circuit 70 is connected to SET node 64. The output terminal of the NOR circuit 70 is connected to the source of a P channel type MOSFET 72. The gate of the MOSFET 72 is connected to the timing controller 50 via node 50a.

The input terminal of a NOT circuit 74 and the output terminal of a NOT circuit 76 are connected to the drain of the MOSFET 72. The output terminal of the NOT circuit 74 and the input terminal of the NOT circuit 76 are respectively connected to the drain of an N channel type MOSFET 78. Accordingly, a storage circuit is formed by the NOT circuits 74, 76. The gate of the MOSFET 78 is also connected to the timing controller 50 via node 50a through which is received the signal SR. The source of the MOSFET 78 is connected to one of the input terminals of a NAND circuit 80 whose other input terminal is connected to the timing controller 50 via node 50a.

The output terminal of the NAND circuit 80 is connected to the gate of a P channel type MOSFET 82. The source of the MOSFET 82 is connected to power source +B, and the drain thereof is connected to the match line of the subsequent stage (for example, match line MATCH1 for precharge controller $58_1$). The timing controller 50, via node 50a, also is connected to the gate of a P channel type MOSFET 84 whose source is also connected to power source +B, and whose drain is connected to the input terminal of a NOT circuit 86 and to the source of the MOSFET 78. The output terminal of the NOT circuit 86 is connected to the gate of an N channel type MOSFET 88 whose source is connected to the match line of the aforementioned subsequent stage, and whose drain thereof is grounded.

Returning again to FIG. 2 it is seen that the match lines MATCH0 through MATCHM are respectively connected to a priority encoder 60. As will be described later, an associative memory cell row, whose match line goes high after a comparison operation in the "search" mode, is one whose stored data matches the supplied data. This priority encoder 60 has an output 60a which provides the controller 22 with the address MATCH-ADDRESS of an associative memory cell row whose match line goes high as a result of the "search" operation. However, when a number of match lines are all high the priority encoder 60 selects, as the address MATCH-ADDRESS, the address of the associative memory cell row having priority in accordance with a predetermined standard, e.g., the lowest address.

All the match lines MATCH0 through MATCHM are also connected to respective input terminals of an OR circuit 62 whose output terminal 62a is also connected to the controller 22 to provide to controller 22 a signal expressing whether at least one of the match lines MATCH0 through MATCHM is high, i.e., a signal ENTIRE-MATCH which expresses that a match was found. A signal SET, which is usually low and which becomes high when all of the match lines MATCH0 through MATCHM are charged (precharged) high is supplied to the precharge controllers 58 from controller 22 via node 64.

Figure 5:
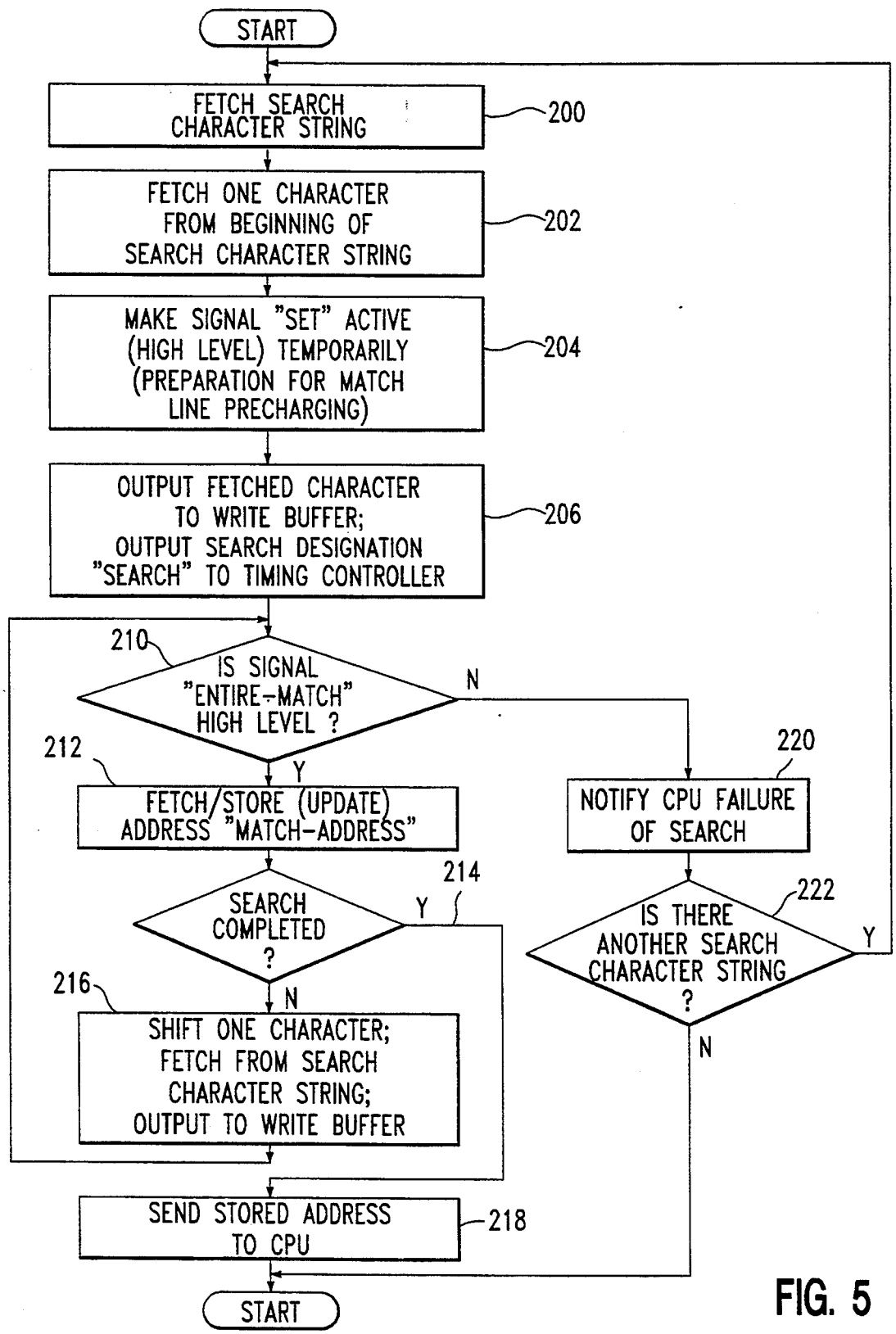
FIG. 5 is a flowchart for explaining the operation of FIGS. 1, 2 and 3.

Search processing of a character string will be described with particular reference to FIG. 5 together with reference to FIGS. 1 to 4. FIG. 5 is an example of search processing in the "search" mode, shown in flow-chart form, and it will be assumed that units of data has already been stored in the respective associative memory cells 28 of the associative memory array 26. The process begins at step 200 when a search processing signal is sent from the CPU 12 to initiate the fetching a search character string stored in the RAM 16. From this search string, data corresponding to one character is fetched (step 202) and the signal SET, node 64, goes high (step 204) causing the respective NOR circuits 70 of the precharge controllers $58_0$ through $58_M$ to go low. Because the MOSFET 72 is a P channel type, it is turned on when the clock signal SR at node 72a is low feeding the output signals from the NOR circuits 70 into the NOT circuits 74 and 76 where they are held.

The character data fetched from the search character string data is fed (step 206) to the write buffer 56, and, synchronously with the signal SET going high, the signal SEARCH is sent to the timing controller 50. Accordingly, a high clock signal WT-SR is sent from the timing controller 50 to the write buffer 56, and a high clock signal SR is sent to the precharge controllers $58_0$ through $58_M$ to precharge the match lines.

When the clock signal SR goes high, the MOSFETs 72 and 84 turn off and the MOSFET 78 turns on to send the high output from the NOT circuit 74 to one of the input terminals of the NAND circuit 80 and the input of NOT circuit 86. Because the high signal SR is also sent to the other input terminal of the NAND circuit 80, the output of the NAND circuit 80 is low, and the MOSFET 82 is turned on and the MOSFET 88 is turned off to couple the lower match line of FIG. 4, through transistor 82, to power source +B which pulls the lower match line of FIG. 4 high.

When the clock signal SR goes low, the input terminal of the NAND circuit 80, to which it is connected, goes low and the output of the NAND circuit 80 goes high to turn off the MOSFET 82. The same low clock signal SR turns off the MOSFET 78 and turns on the MOSFET 84 to allow the power source +B to drive the input of the NOT circuit 86 high and maintain the MOSFET 88 in an off condition. Accordingly, the lower match line of FIG. 4 remains high for it is now electrically isolated by the turned off transistors 82 and 88 and thus is effectively disconnected from the precharge controller 58. By the above-described procedure at each of the precharge controllers $58_0$ through $58_M$ respectively, the match lines MATCH0 through MATCHM are charged high, i.e., precharged.

When the high clock signal WT-SR is sent to the write buffer 56, the bit line pairs BL0,BL0' through BLN,BLN' are driven to the levels set by the character data in the respective associative memory cells 28 of the associative memory cell array 26. If the data Q stored in the NOT circuit 30 is "1" (i.e., high), the MOSFET 38 is turned on, and if the data Q' stored in the NOT circuit 32 is also "1" (high), the MOSFET 40 is turned on. Accordingly, if the data Q (Q') held in the loop of the NOT circuits 30, 32 and the data D (D') supplied via the bit line pair BL,BL' match, the MOSFET 42 is not turned on. However, if the data Q (Q') and the data D (D') do not match, electric current flows from the drain to the source of which ever one of the MOSFETs 38 or 40 which is on and the MOSFET 42 is turned on. The levels of the precharged match lines MATCH are discharged, i.e., pulled low.

The above-described data comparison is effected simultaneously at all of the associative memory cells 28 when the clock signal SR is low. Accordingly, precharging and data comparison are effected during one cycle of the clock signal SR. Because a plurality of the associative memory cells 28 (an associative memory cell row) is connected to a single match line, the operation for comparing the character data stored in the associative memory cell row and the input character data is completed during one cycle of the clock signal SR. A match line is maintained in a high state only when the MOSFETs 42 of all of the associative memory cells 28 connected to the match line are not on, i.e., only when the stored character data, stored in the associative memory cell row, and the fetched character data, sent to the write buffer 56, match. When these data do not match, the match line becomes low.

Accordingly, when the character data input to the write buffer 56 is stored in at least one of the associative memory cell rows, the signal ENTIRE-MATCH from the OR circuit 62 becomes high, and the address of the associative memory cell row, storing the character data is fed from the priority encoder 60 as the address MATCH-ADDRESS. While this comparison operation is being effected in the associative memory cell rows, the clock signal SR becomes low and the MOSFETs 72 in the precharge controllers 58 are turned on. Therefore, the levels of the respective match lines MATCH are transferred to and held in the NOT circuits 74, 76 of the precharge controllers 58 of subsequent stages (e.g., the level of the match line MATCH0 is transferred to the precharge controller $58_1$).

Due to the above processes, when the clock signal SR becomes high, the MOSFET 78 is turned on. Now, if the signal output from the NOT circuit 74 is high, the MOSFET 82 is turned on and the match line MATCH is charged high. On the other hand, if the signal output from the NOT circuit 74 is low, the signal output from the NOT circuit 86 is high and the MOSFET 88 is turned on, pulling the match line MATCH low. In this way, if the match line of the previous stage is high, the match line of the subsequent stage becomes high. If the match line of the previous stage is low, the match line of the subsequent stage becomes low. Due to the input signal CONTROL-IN fed from the controller 22 to the precharge controller $58_0$, the match line MATCH0 always becomes low after one comparison operation has been effected.

In step 210, a determination is made as to whether the signal ENTIRE-MATCH, from the OR circuit 62, is high. If the answer to the answer to step 210 is "Yes", the process proceeds to step 212 where the address MATCH-ADDRESS from the priority encoder 60 is fetched and stored. In step 214, a determination is made as to whether all searching has been completed, i.e., as to whether character data of all of the characters forming the search character string have been sent to the write buffer 56. If the answer to the determination in step 214 is "No", then in step 216, the character data fetched from the search character string data is shifted one character and is again fetched and sent to the write buffer 56 and the process returns to step 210. Thereafter, while the signal ENTIRE-MATCH is high, the processes of steps 210 through 216 are repeated until the answer to step 214 is "Yes". Each time step 212 is executed, the stored address (MATCH-ADDRESS) is updated.

These operations are illustrated in FIGS. 6A, 6B, 6C, and 6D where the associative memory cell row is schematically represented. Explanation will be given of a case in which the stored character string "ABCA" is searched for from the character string "BABCABB . . .".

Figure 6:
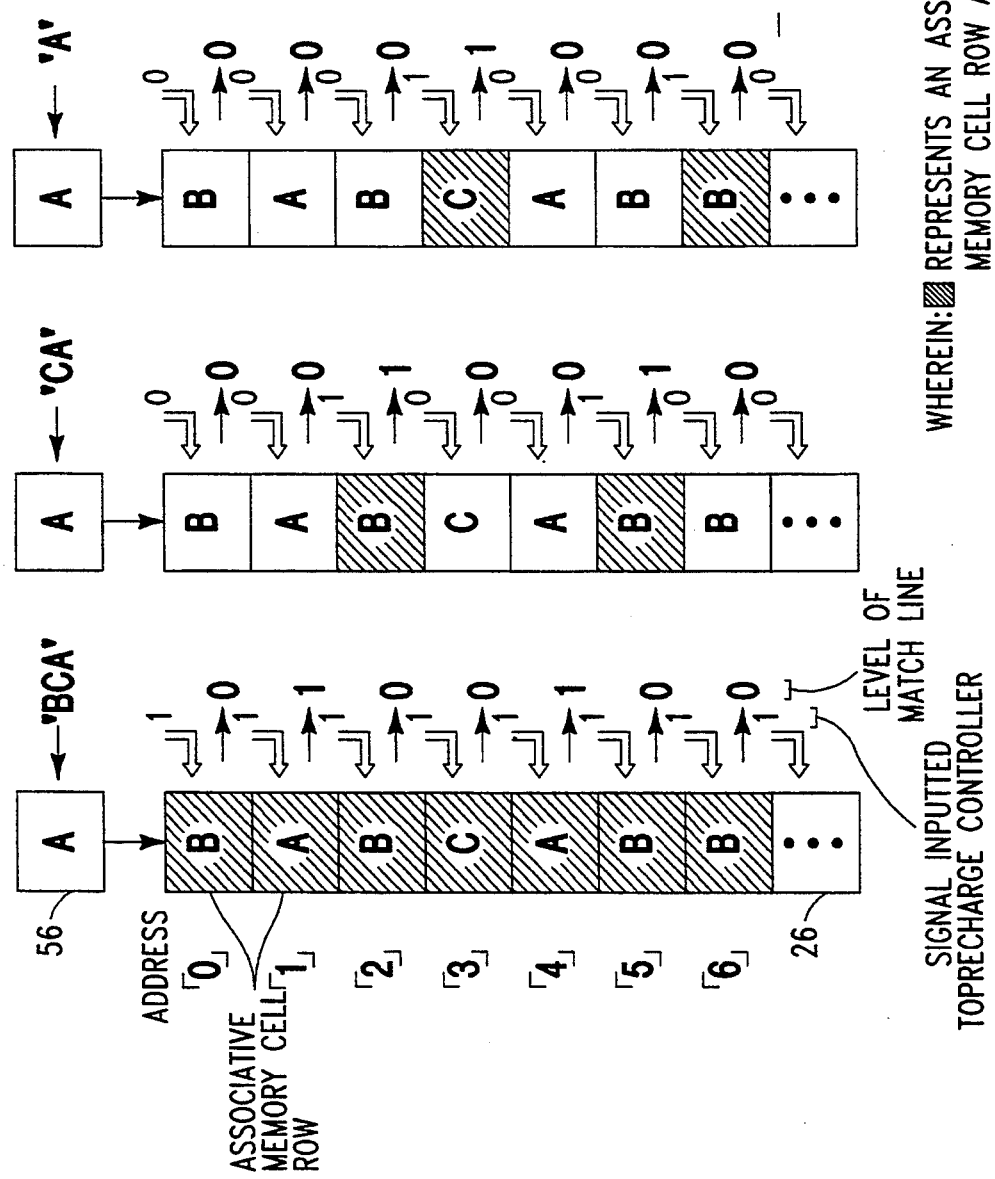
FIGS. 6A through 6D are conceptual views for explaining the search operation of FIGS. 1, 2, and 3.

FIG. 6A illustrates a state when comparison is being made with the first character "A" of the search character string. Data representing the character "A" is sent to the write buffer 56. The signal SET goes high and is fed to the precharge controllers 58 to cause all of the match lines to become high, and comparison operations are undertaken in all of the associative memory cell rows. As a result of the comparison operations, only those match lines which correspond to the associative memory cell rows whose addresses are "1" and "4" are maintained high. These results are sent to the precharge controllers 58 of the subsequent stages (see FIG. 6B). When comparison is now made with the next character "B", only the match lines corresponding to the associative memory cell rows whose addresses are "2" and "5" are caused to become high, and comparison operations are performed only at the associative memory cell rows whose addresses are "2" and "5".

Because the character "B" is stored in both of the associative memory cell rows whose addresses are "2" and "5", the corresponding match lines are maintained high even after the comparison operations are completed. These results are sent to the precharge controllers 58 of the subsequent stages (see FIG. 6C). Accordingly, when comparison with the next character "C" is effected, only the match lines corresponding to the associative memory cell rows whose addresses are "3" and "6" are caused to become high. Here, because the character stored in the associative memory cell row whose address is "6" is not "C", only the match line corresponding to the associative memory cell row whose address is "3" is maintained high, and this result is fed to the precharge controller 58 of the subsequent stage (see FIG. 6D). The match lines whose address is "6" are discharged.

Accordingly, when the character data of the last character "D" of the search character string is sent to the write buffer 56, a comparison operation is effected only in the associative memory cell row whose address is "4". A comparison operation is effected in the associative memory cell row whose address is "4", and if the corresponding match line is high, searching is completed (the answer to the determination in step 214 of the flowchart in FIG. 5 is "Yes"). As can be understood from the above description, if, for example, the search character string was "ABCAB", in addition to the above-described operations, the character data for the character "B" would be sent to the write buffer 56, and a comparison operation performed.

Accordingly, even if the length of the search character string varies, only the number of times the comparison operation is repeated varies, and there is no need to change the circuit structure to match the maximum length of the search character string as required by the prior art. Further, the comparison operations for searching are effected in parallel at the respective associative memory cell rows. Regardless of the length of the character string to be searched, search processing is completed if the comparison operations are performed the same number of times as the number of characters in the search character string. Therefore, especially in cases in which the character string to be searched is very large, search processing can be completed in an extremely short time as compared with the prior art.

In the prior art, the number of circuits invalidating the comparison results varies in accordance with the length of the search character string. Therefore, it is necessary to use associative memory cells or the like to which are added circuits which effect DC processing in which the comparison results from specific circuits are invalidated in accordance with the length of the search character string or the comparison results of the specific circuits are compulsorily set as "matching". In the present invention, however, there is no need to perform special processing even if the length of the search character string varies. Therefore, there is no need to use associative memory cells or the like to which circuits effecting DC processing are added, and the device can be made more compact.

The match lines for the associative memory cell rows for which the comparison results of the associative memory cell rows of the previous stages were "not matching" go low and comparison operations are not performed. Therefore, as the comparison operations are repeated, the number of associative memory cell rows for which comparison operations need not be performed increases, and the amount of electric power which is consumed can be decreased. This is especially true when the circuits use CMOS (complimentary MOS) transistors for here transient current flows when the logic state varies, and a large amount of electric power is consumed. Therefore, even when such CMOS devices are used the amount of electric power consumed can be greatly reduced by employing the above-described invention.

Returning now to FIG. 5, when the answer to the determination in step 214 of the flowchart is "Yes", then in step 218, the stored address MATCH-ADDRESS is sent to the CPU 12 and processing is completed. Further, when the signal ENTIRE-MATCH becomes low, while the processes of steps 210 through 216 are being repeated, it can be determined that the search character string is not stored in the associative memory cell array 26. As a result, in step 220, the CPU 12 is notified that the search failed, and in step 222, a determination is made as to whether there is another search character string.

If the answer to the determination in step 222 is "Yes", the process returns to step 200, and the above-described processes are repeated but if the answer to the determination in step 222 is "No", search processing ends.

Figure 7:
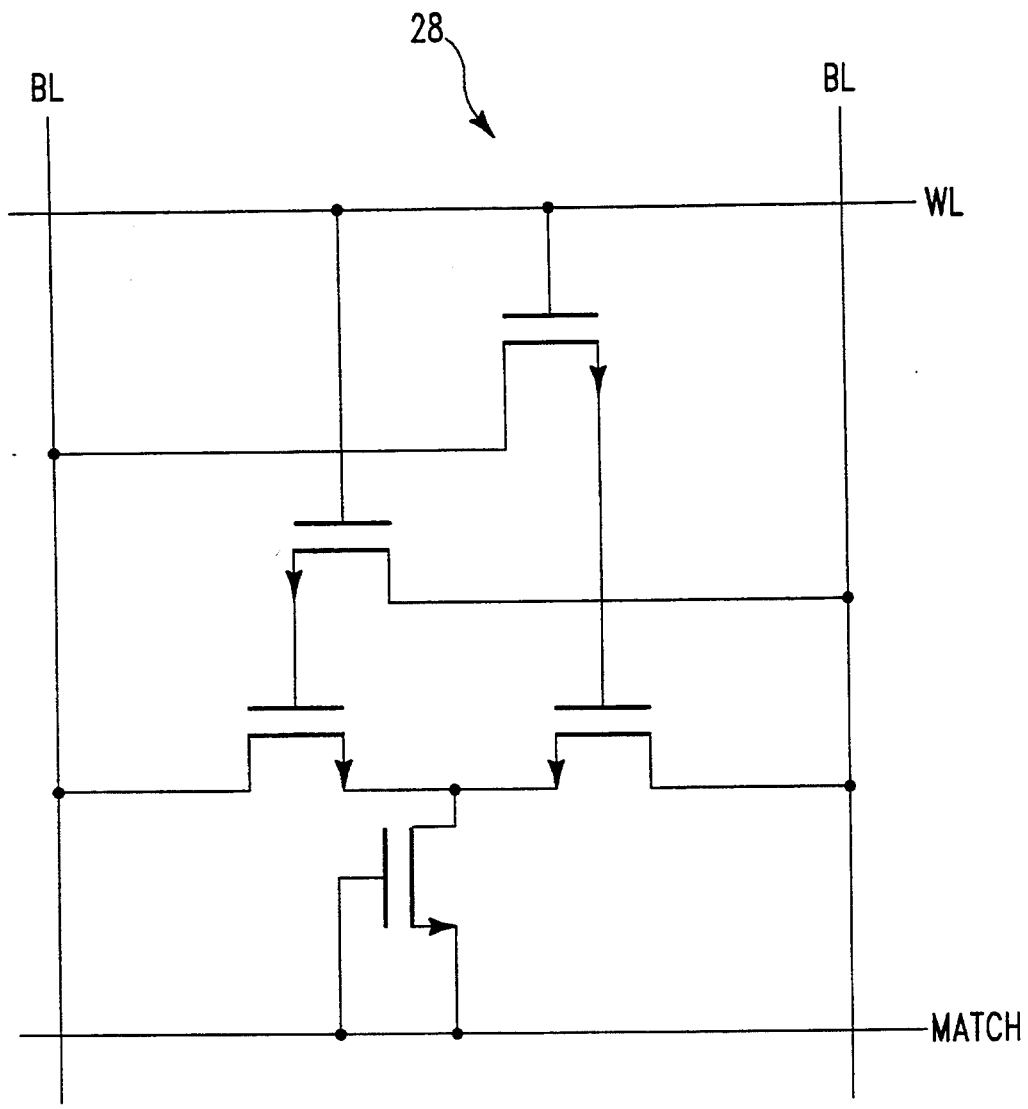
FIG. 7 is a circuit diagram illustrating another example of the unit cell.

The search processing illustrated by the flowchart in FIG. 5 is but one example, and it is possible, for example, to request the addresses of a group of associative memory cell rows in which the longest character string matching the search character string is stored. Further, the associative memory cells 28 are not limited to the SRAM type structure illustrated in FIG. 3, and a DRAM type structure such as that illustrated in FIG. 7 can be used.

A plurality of character string search devices 20 may be provided, and comparison operations with the same character data may be effected simultaneously in the respective associative memory cell arrays 26. In this case, the same data is sent to each of the plurality of character string search devices 20 as search data, and CONTROL-OUT (see FIG. 2) of the precharge controller 58M of the character string search device 20 of the previous stage and the terminal 66 (CONTROL-IN) of the precharge controller $58_0$ of the character string search device 20 of the subsequent stage are connected together. Accordingly, the precharge controllers $58_0$ through $58_M$ of the respective character string search devices 20 may be connected together. Besides, all matching signals ENTIRE-MATCH are combined by OR circuit 62.

Figure 8:
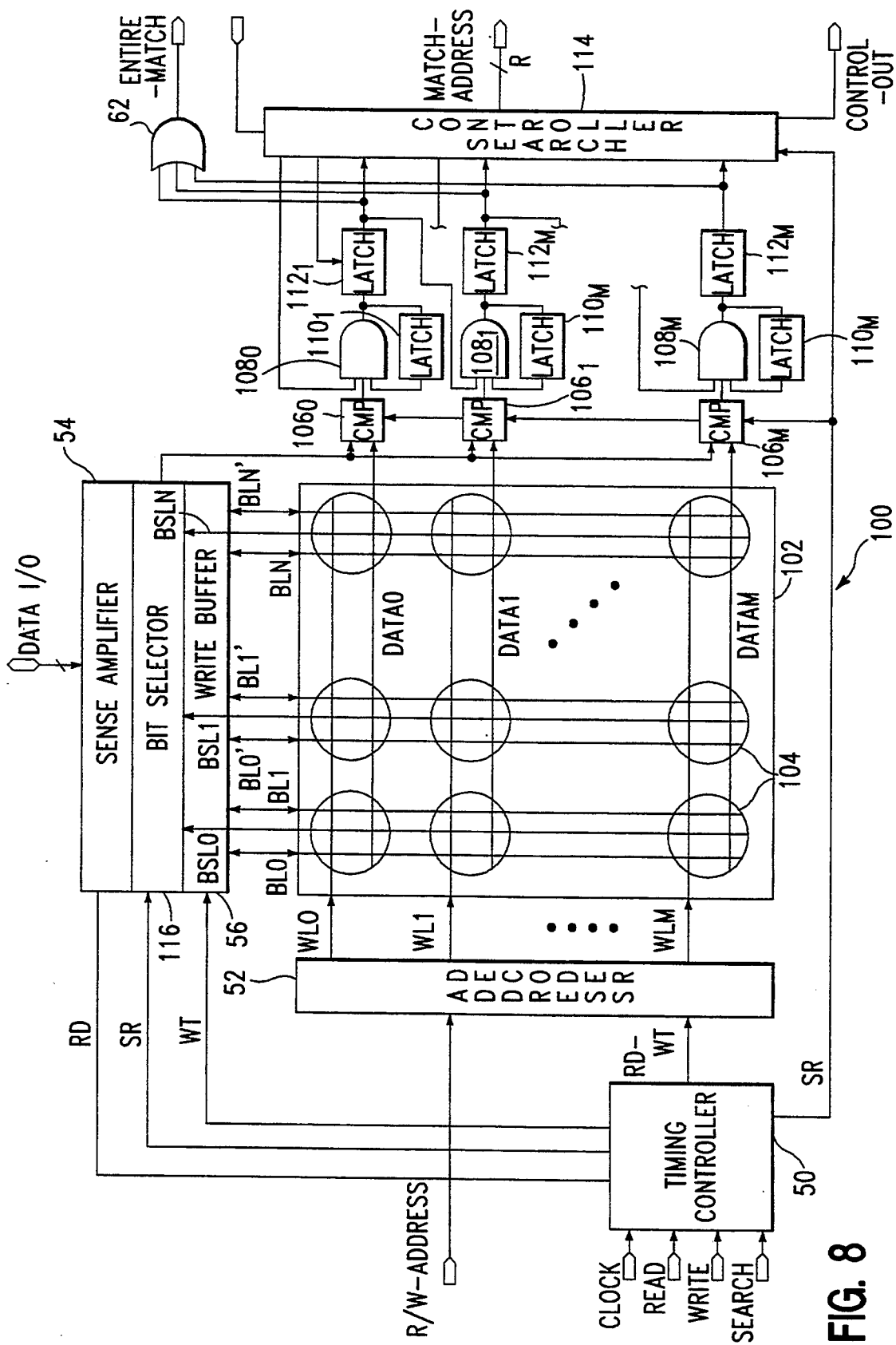
FIG. 8 is a block diagram illustrating a different schematic structure of a character string search device.

Next, a second embodiment of the present invention will be described. Parts which are the same as those of the first embodiment are denoted by the same reference numerals, and description thereof is omitted. A character string search device 100 relating to the second embodiment is illustrated in FIG. 8.

In the character string search device 100, instead of the associative memory cell array of the first embodiment, a RAM cell array 102 in which RAM cells (unit cells) 104 are disposed in matrix form is provided. In the RAM cell array 102, (M+1) data lines DATA0 through DATAM are provided in place of the match lines, and (N+1) bit select lines BSL0 through BSLN are provided. The bit select lines BSL0 through BSLN are respectively connected to a bit selector 116. The bit selector 116 is connected to the controller 22 and the timing controller 50. During "search", the clock signal SR is sent from the timing controller 50 to the bit selector 116 which holds data from the controller 22 during "search" and the clock signal WT is transmitted to the write buffer 56 only during a "write" operation.

When the clock signal SR is high, the bit selector 116 makes the bit select lines BSL0 through BSLN high one at a time and in order. The data lines DATA0 through DATAM are connected to respective ones of the two input terminals of comparators $106_0$ through $106_M$. When any one of the bit select lines BSL0 through BSLN is made high by the bit selector 116, the data, which is stored in the RAM cell 104 connected to the bit select line BSL which is made high, is fed to the comparators $106_0$ through $106_M$ via the data lines DATA0 through DATAM.

Figure 9:
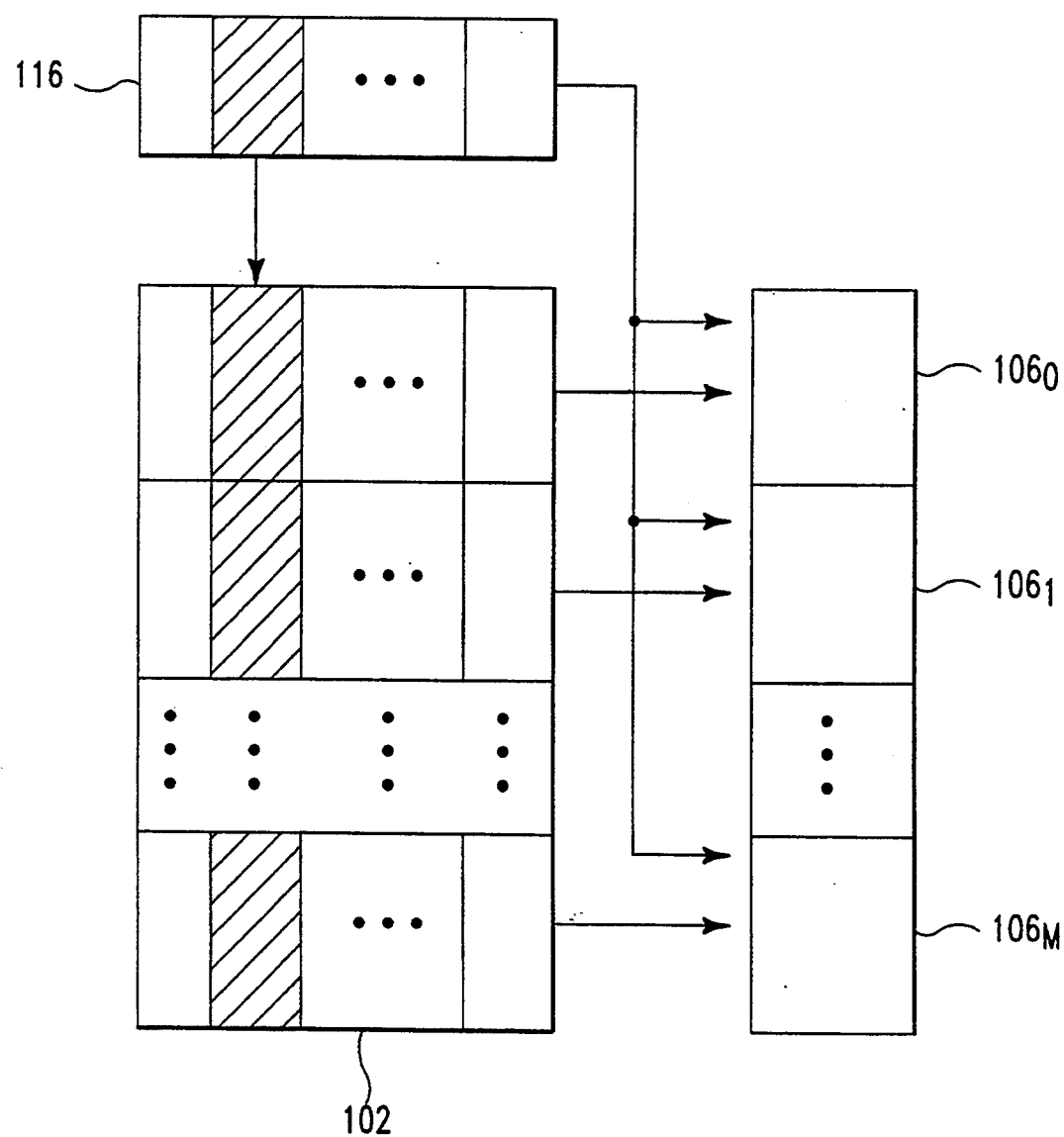
FIG. 9 is a conceptual view for explaining processing of comparing character data per bit in FIG. 8.

The respective other input terminals of the comparators $106_0$ through $106_M$ are connected to the bit selector 116. During a "search" operation, the bit selector 116 makes the bit select lines BSL0 through BSLN high one at a time and in order, as described above, and successively feeds to the comparators $106_0$ through $106_M$ data of the corresponding bit among the character data from the controller 22 and stored. For example, as illustrated in FIG. 9, when the bit select line BSL1 is high, among the stored character data, data of the second bit is selected. In this way, among the character data which are stored respectively in the RAM cell rows and the bit selector 116, one-bit data of the same bit position is provided, in order, to the comparators $106_0$ through $106_M$ from the respective RAM cell rows and the bit selector 116.

The comparators, $106_0$ through $106_M$, are respectively connected to the timing controller 50, and during a "search" operation, the clock signal SR is sent thereto from the timing controller 50. In this way, data of 1 bit which is fed from the bit selector 116 and data of one bit which is fed via the data lines DATA0 through DATAM are compared and if they match, the output signal becomes high, but if they do not match, the output signal becomes low. As described above, character data is successively sent one bit at a time to the comparators 106 from the bit selector 116 and from the data lines DATA0 through DATAM. Therefore, the comparison results of each bit are successively sent from the comparators 106.

The output terminals of the comparators $106_0$ through $106_M$ are connected to respective ones of the three input terminals of AND circuits $108_0$ through $108_m$. The output terminals of the AND circuits $108_0$ through $108_M$ are connected to the input terminals of latches $110_0$ through $110_M$, respectively. The output terminals of the latches $110_0$ through $110_M$ are connected to input terminals of the AND circuits $108_0$ through $108_M$. The latches $110_0$ through $110_M$ are connected to a search controller 114 which will be described later. A reset signal from the search controller 114 resets the latches $110_0$ through $110_M$ high.

Accordingly, the levels maintained by the latches 110 and the levels of the signals from the AND circuits 108 are both maintained high. If the comparison results become low even one time, the levels maintained by the latches 110 and the levels of the signals from the AND circuits 108 become low. However, when a low signal is sent to the remaining input terminals of the AND circuits 108, even if the comparison results of each bit are always high, the signals from the AND circuits 108 and the levels maintained by the latches 110 become low.

The output terminals of the AND circuits $108_0$ through $108_M$ are connected to the input terminals of latches $112_0$ through $112_M$. The output terminals and the control terminals of the latches $112_0$ through $112_M$ are connected to the search controller 114. When a reset signal is sent to the latches $112_0$ through $112_M$ in the same way as to the latches $110_0$ through $110_M$, the latches $112_0$ through $112_M$ are reset high. Further, the latches $112_0$ through $112_M$ fetch data only when a fetch designation is received from the search controller 114. The output terminals of the latches $112_0$ through $112_m$ are successively connected to the input terminals of the AND circuits 108 connected to the data lines of the respective subsequent stages.

The search controller 114 is connected to the timing controller 50, via the line SR, and during a "search" operation, the clock signal SR is sent thereto from the timing controller 50. The search controller 114 counts the number of pulses of the clock signal SR and determines whether the comparison operation with the character data, held in the bit selector 116, has been completed. When the comparison operation has been completed, the fetch designation is sent to the respective latches $112_0$ through $112_M$. As described above, because data comparison is effected per bit, if, for example, the data is 8 bits, the comparison operation is completed only when 8 pulses are counted, and then, a new fetch command is sent. In this way, at the point in time when the comparison with the character data held in the bit selector 116 is completed, the levels of the output signals of the AND circuits 108 are maintained in the latches 112.

The levels maintained in the latches 112 have the same meaning as the levels of the match lines when comparison operations have been completed in the first described embodiment. The levels maintained in the latches 112 become high only when the character data stored in the RAM cell rows matches the character data held in the bit selector 116. When the levels maintained in the latches 112 are low, the signals from the AND circuits 108 in the next cycle of comparison operations always become low.

It should be noted that a number of the character string search devices 100 can be coupled together, and comparison operations for the same character data can be performed simultaneously in each of the character string search devices 100. In this case, the CONTROL-OUT nodes of the search controllers 114 may be connected together, and the same data may be fed to each of the character string search devices 100 as search data.

Figure 10:
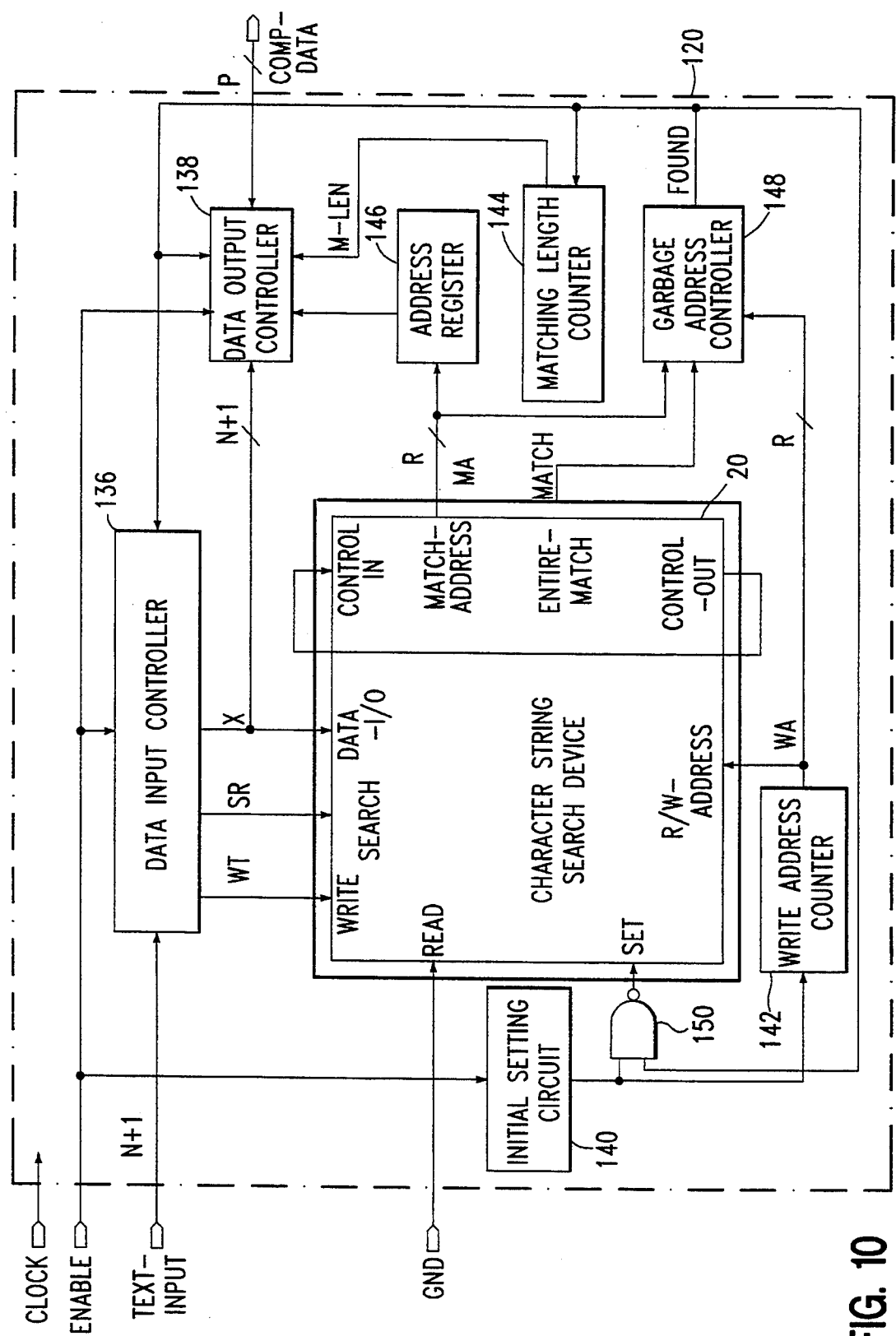
FIG. 10 is a block diagram illustrating a schematic structure of still another a character string compression controller.

Still another variation of the present invention will be described. Parts which are the same as those of the previously described device are denoted by the same reference numerals, and description thereof is omitted. In this variation, instead of the controller 22 of the first embodiment, a character string compression controller 120 illustrated in FIG. 10 is provided.

The system clock signal CLOCK, a signal ENABLE' which becomes low when compression processing is effected, and the character string data to be compressed (original data) TEXT-INPUT are all sent to the character string compression controller 120. The signal ENABLE' is supplied to a data input controller 136, a data output controller 138, and an initial setting circuit 140, respectively, so as to operate these circuits during compression processing. Further, the character string data to be compressed TEXT-INPUT is also supplied to the data input controller 136.

The data input controller 136 is connected to the character string search device 20 and to the data output controller 138. In the data input controller 136, one character of data is fetched from the beginning of a supplied character string to be compressed, and sent to the write buffer 56 of device 20 as shown in FIG. 2 and the data output controller 138. The data input controller 136, also puts out a search designation SEARCH and a write designation WRITE, in order, to the character string search device 20 and repeats the outputs while the position of fetching the character data is shifted one character at a time from the beginning to the end of the character string. In this way, during the search signal SEARCH, each character of data stored in the respective associative memory cell rows, in device 20, is compared to each character of data held in the write buffer 56.

Subsequently, during the write signal WRITE, the character data is written into the associative memory cell array 26.

A write address counter 142 is connected to the initial setting circuit 140, to the character string search device 20, via an AND circuit 150, and to a garbage address controller 148. When the signal ENABLE' becomes low, the output of the initial setting circuit 140 goes low. Accordingly, the signal SET from the AND circuit 150 becomes high.

The write address counter 142 holds the address of a specific associative memory cell row of the associative memory cell array 26 as a count value which is sent to the character string search device 20 and to the garbage address controller 148 as an address R/W ADDRESS. When the signal from the initial setting circuit 140 becomes low, the write address counter 142 resets the held address to "0",i.e., the address of the associative memory cell row at the beginning of the associative memory cell array 26, and the count value or (address) is increased by 1 each time data is written to the associative memory cell array 26.

Accordingly, when the character data held in the write buffer 56 is written into the associative memory cell array 26, along with the address R/W-ADDRESS, the associative memory cell row in which the character data is written is successively shifted up. After the address of the associative memory cell row connected to the word line WLM is reached, the write address counter 142 resets the count value to "0".

The garbage address controller 148 is connected to the character string search device 20, and the signal ENTIRE-MATCH and the address MATCH-ADDRESS are sent thereto from the character string search device 20. (When the comparison results of a plurality of associative memory cell rows in the character string search device 20 are "matching", the lowest address is the address MATCH-ADDRESS, as explained previously. When, as the result of the comparison operations in the character string search device 20, the signal ENTIRE-MATCH is high and the write address counter 142 has not gone once through all of the addresses, the garbage address controller 148 compares the address R/W-ADDRESS from the write address counter 142 and the address MATCH-ADDRESS. When the address MATCH-ADDRESS is equal or greater, an output signal FOUND goes low. This FOUND signal means that this comparison operation is invalid. The signal FOUND is also held low when character string compression processing begins.

A matching length counter 144 and the data output controller 138 and the data input controller 136 and the character string search device 20, via the NAND circuit 150, are connected to the output of the garbage address controller 148 so that the signal FOUND can be sent to each.

After comparison operations have been effected at the character string search device 20, when the signal FOUND is high, the matching length counter 144 counts up the count value (matching length). When the signal FOUND is low, i.e., when character string compression processing begins and when the results of this comparison operation are invalid, the count value is reset to "0". The data output controller 138 is connected to the matching length counter 144, and the matching length counter 144 outputs the count value to the data output controller 138 as matching length M-LEN.

An address register 146 is also connected to the character string search device 20 from which the address MATCH-ADDRESS is sent to the address register 146 which holds the address MATCH-ADDRESS and forwards it to the data output controller 138 as address S-ADR.

The data output controller 138 holds the matching length M-LEN, from the matching length counter 144, and the address S-ADR from the address register 146. When the signal FOUND continues high even after a comparison operation has been effected in the character string search device 20, the signal FOUND goes low after the subsequent comparison operation and remains low for comparison operations thereafter, or the data input controller 136 stops and the data from the data input controller 136 is, based on the held address S-ADR and the data M-REN, replaced by other data (compressed), and appears as compressed character string data COMP-DATA at node 138a.

Figure 11:
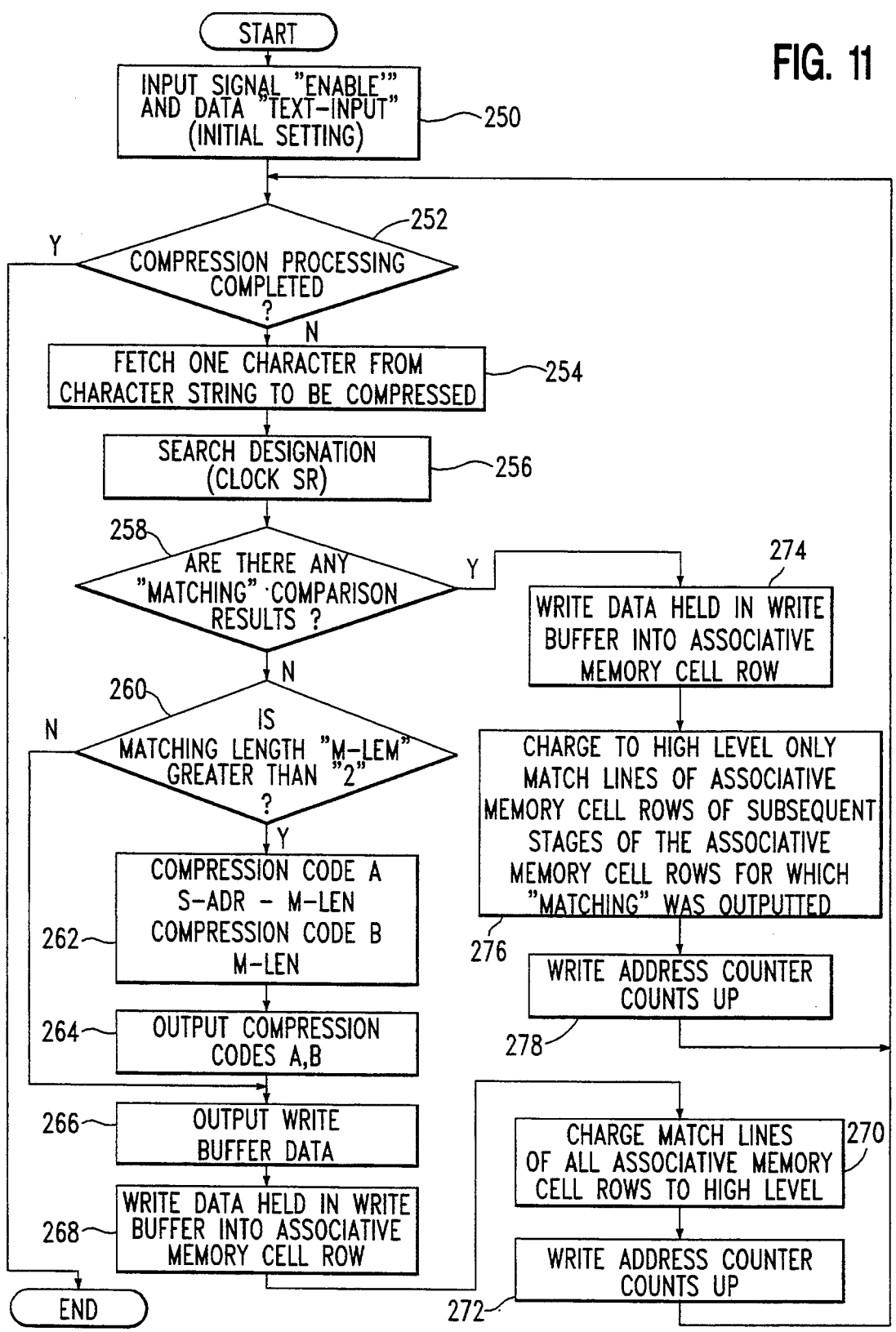
FIG. 11 is a flowchart explaining operation of the circuit of FIG. 10.

The compression processing, which is achieved by the character string compression controller 120 of FIG. 10 and the character string search device 20, will be described with reference to the flowchart in FIG. 11.

In step 250, the signal ENABLE' and the character string data to be compressed TEXT-INPUT, which represents the character string to be compressed, are received and compression processing begins, i.e., the character string data to be compressed is held in the data input controller 136. A reset signal is sent from the initial setting circuit 140 to the write address counter 142 and the matching length counter 148 so that the count values of the respective counters are reset to "0". Further, the signal SET from the initial setting circuit 140 to the character string search device 20, via the NAND circuit 150, becomes high and is sent to the precharge controllers 58. As described above, when the signal SET becomes high the match lines become high synchronously with the clock signal SR.

In step 252, a determination is made as to whether compression processing has been completed at the data input controller 136. If compression processing has not been completed, character data corresponding to one character at the beginning is fetched from the held character string data and is sent to the write buffer 56 of the character string search device 20. Also, the search designation SEARCH is fed from the data input controller 136. In this way, the clock signal SR and the clock signal WT-SR are received from the timing controller 50 and comparison operations for each associative memory cell row are realized as above described. In subsequent step 258, another determination is made at the data output controller 138 as to whether there are any associative memory cell rows whose comparison result is "matching", that is, a determination is made as to whether the signal FOUND is high or low.

In the initial comparison operation, character data is not written into the respective associative memory cells 28 of the associative memory cell array 26. Therefore, the data stored in the respective associative memory cells 28 is undefined, and even if there was an associative memory cell row for which the comparison result was "matching" (i.e., the signal ENTIRE-MATCH was maintained high), it would be by chance. Here, the address R/W-ADDRESS and the address MATCH-ADDRESS, which are received when the signal ENTIRE-MATCH is maintained high and the write address counter 142 has not gone once through all of the addresses, are compared in the garbage address controller 148. When the address MATCH-ADDRESS is equal or greater, the results of this comparison operation are invalid, and the signal FOUND becomes low (representing "invalid") and the answer to the determination in step 258 is "No", and the process proceeds to step 260.

In step 260, in the data output controller 138, a determination is made as to whether the count value M-LEN, which represents the matching length from the matching length counter 144 and which is held, is greater than "2", i.e., a determination is made as to whether the signal FOUND representing "valid" has been received for two comparison operations in the past. At this point in time, because the held matching length M-LEN is "0", the answer to the determination in step 260 is "No", and the flow diverts to step 266, where the character data sent from the data input controller 136 to the data output controller 138, i.e., the character data held in the write buffer 56, appears as compressed data COMP-DATA.

In subsequent step 268, the write designation WRITE is sent from the data input controller 136 and the character data, held in the write buffer 56, is written into the associative memory cell array 26. The associative memory cell row into which the character data is written corresponding to the address "0" is held in the write address counter 142.

In step 270, the signal FOUND (low) is supplied via the NAND circuit 150 to the character string search device 20 as the signal SET, and the respective match lines are charged high by the precharge controllers 58. Accordingly, the signal SET goes low. In subsequent step 272, the count value is counted up at the write address counter 142, and the process returns to step 252.

In this way, while the answers to the determinations in steps 258, 260 are "No", the character data held in the write buffer 56 is sent from the data output controller 138 as compressed character string data COMP-DATA and is stored in the associative memory cell array 26. Further, as the count value of the write address counter 142 is counted up, the address of the associative memory cell row in which the character data is written is successively shifted each time a comparison operation is effected.

When the character data held in the write buffer 56 and the character data stored in any of the associative memory cell rows match, the signal FOUND, from the garbage address controller 148, becomes high (expressing "valid"), and the answer to the determination in step 258 is "Yes". In this case, as in step 266, data is not sent and the count value is counted up by the signal FOUND representing "valid" to the matching length counter 144. This count value is held in the data output controller 138 as the matching length M-LEN.

In step 274, the writing of the character data to the associative memory cell array 26 is effected in the same way as in step 268. In step 276, only the match lines of the associative memory rows of the subsequent stages of the associative memory rows whose match lines were maintained high after a comparison operation become high, and the match lines of the other associative memory rows become low. In subsequent step 278, counting up of the count value is accomplished in the write address counter 142, and the process returns to step 252.

In this way, while the determination in step 258 is repeated and the answer thereto is "Yes", only the writing of the character data to the associative memory cell array 26 and the counting up of the matching length M-LEN are repeated. A case in which the answer for two or more repetitions of the determination in step 258 is "Yes" is a case in which the character string formed from character data sent continuously to the write buffer 56 is stored in the associative memory cell array 26 as well, i.e., is a case in which a repeat character string, which is formed by characters of two or more characters of the character string to be compressed, has been discovered. After the processes in steps 274 through 278 have been repeated two or more times, if the determination in step 258 is "No", i.e., if there are associative memory cell rows whose comparison results were "matching" in two of the comparison operations in the past and if there are no associative memory cell rows whose comparison results are "matching" in this comparison operation, the determination in step 260 is "Yes", and the process proceeds to step 262.

In step 262, in the data output controller 138, a compression code for compressing the repeat character string discovered above is requested. Here, a compression code is used which is formed by a compression code A, which represents a pointer indicating a position of a character string which is the same as the previous repeat character string, and a compression code B, which represents the length of the repeat character string. The difference between the address S-ADR held in the data output controller 138 and the matching length M-LEN (S-ADR−M-LEN) is compression code A, and the matching length M-LEN is compression code B. In subsequent step 264, the compression code A and the compression code B determined as described above are provided.

In order to distinguish between the compression code and the character data when the compressed character string is restored, each time the compression codes are output, the data output controller 138 inserts a code, which represents a separation, between the character data and the compression code. In this way, the length of the compressed character string data COMP-DATA, from the data output controller 138, is shorter than the character string data to be compressed TEXT-INPUT sent to the character string compression controller 120. By repeating the above-described processes, the character string data to be compressed TEXT-INPUT is converted into the compressed character string data COMP-DATA.

Figure 12A:
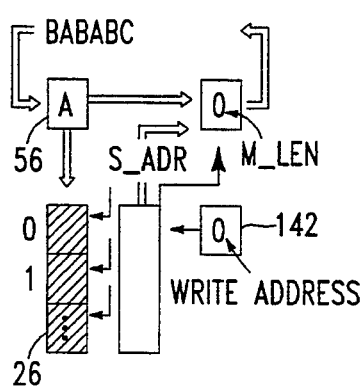
FIGS. 12A through 12H are conceptual views for explaining compression operations in the circuit of FIG. 10.

The above-described compression processes will now be described more concretely with reference to FIGS. 12 and 13 and by an example of compressing the character string to be compressed "ABABABC". When a character string data to be compressed "ABABABC", is sent to the character string compression controller 120, as illustrated in FIG. 12A, the character data corresponding to the beginning character "A" is held in the write buffer 56 and is sent to the data output controller 138. At this time, the count values of the write address counter 142 and the matching length counter 148 are reset to "0", and all of the match lines are charged high. Accordingly, when the search designation SEARCH is fed to the character string search device 20, comparison operations are effected in all of the associative memory cell rows. (The portions illustrated by hatching in the figures represent associative memory cell rows whose match line is high.)

Figure 12B:
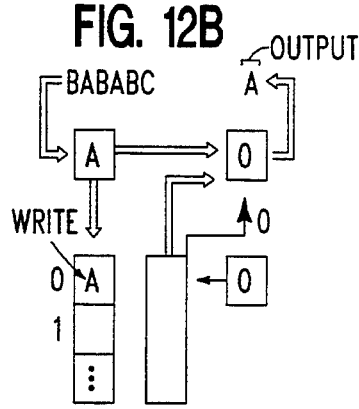

Even if the signal ENTIRE-MATCH is maintained high after the comparison operations have been effected, because the address R/W-ADDRESS held in the write address counter 142 is "0" as described above, the address MATCH-ADDRESS does not become equal to or less than the address R/W ADDRESS, and the signal FOUND, from the garbage address controller 148, becomes low, i.e., "invalid", and represented by "0" in FIG. 12B. In this way, the character data "A" held in the write buffer 56 is fed from the data output controller 138 as compressed character string data COMP-DATA, and is written into the associative memory cell row, whose address is "0", of the associative memory cell array 26.

Figure 12C:
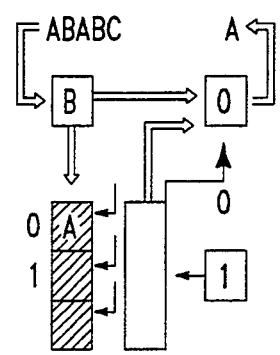
Figure 12D:
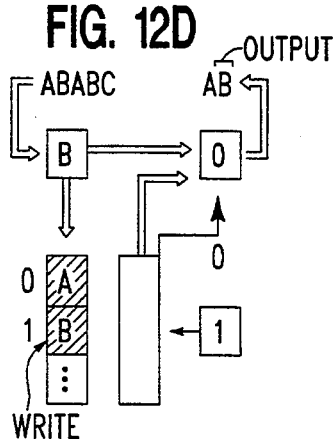

Next, as illustrated in FIG. 12C, the character data of the second character "B" is held in the write buffer 56. After all of the match lines have become high, comparison operations are effected in all of the associative memory cell rows. At this point in time, the address R/W ADDRESS held in the write address counter 142 is counted up to "1". When the garbage address controller 148 emits the signal FOUND, which represents "valid", the character data held in the write buffer 56 and the character data stored in the associative memory cell row whose address is "0" match. However, as illustrated in FIG. 12C, because these data do not match, the signal FOUND becomes low as shown in FIG. 12D and the character data "B", from the data output controller 138, is written to the address "1" of the associative memory cell array 26.

Figure 12E:
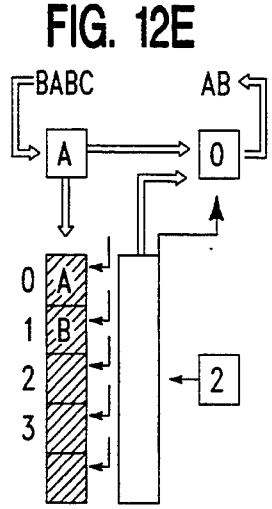
Figure 12F:
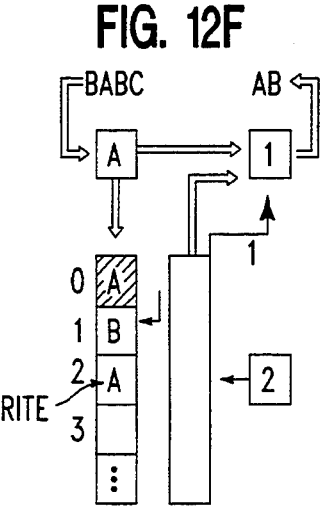

Next, as illustrated in FIG. 12E, the character data of the third character "A" is held in the write buffer 56. After all of the match lines have become high, comparison operations are effected at all of the associative memory cell rows. At this time, the character data held in the write buffer 56 and the character data stored in the associative memory cell row whose address is "0" match, and the MATCH-ADDRESS becomes "0". Therefore, as illustrated in FIG. 12F, the signal FOUND, from the garbage address controller 148, becomes high (represented by "1" in the figures). Accordingly, character data is not realized at the data output controller 138, and the character data held in the write buffer 56 is written to the address "2" of the associative memory cell array 26 and the matching length M-LEN is counted up to "1".

Figure 12G:
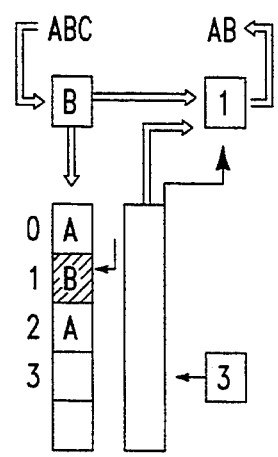
Figure 12H:
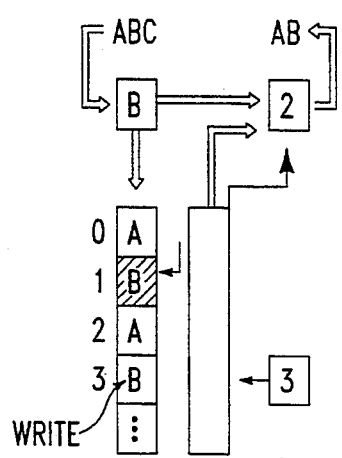

Subsequently, as illustrated in FIG. 12G, the character data of the fourth character "B" is held in the write buffer 56. Only the match line of the address (address "1") after the address whose character data matched becomes high, and comparison processing occurs only at the associative memory cell row whose address is "1". Because the results of this comparison operation are also "matching", as illustrated in FIG. 12H, the signal FOUND continues high. Character data is not realized at the data output controller 138, and the character data held in the write buffer 56 is written to the address "3" of the associative memory cell array 26 and the matching length M-LEN, which expresses the matching length, is counted up to "2".

As illustrated in FIG. 13A, the character data of the fifth character "A" is held in the write buffer 56. Only the match line of address "2" becomes high, and a comparison operation is effected. The results of this comparison operation are also "matching", and, as illustrated in FIG. 13B, the signal FOUND continues high. Character data does not appear at the output controller 138, the character data held in the write buffer 56 is written to the address "4" of the associative memory cell array 26, and the matching length M-LEN is counted up to "3".

Next, as illustrated in FIG. 13C, character data of the sixth character "B" is held in the write buffer 56. Only the match line of the address "3" becomes high, and a comparison operation is effected. The results of this comparison are also "matching". As illustrated in FIG. 13D, the signal FOUND continues high and character data is not presented at the data output controller 138, the character data held in the write buffer 56 is written to the address "4" of the associative memory cell array 26, and the matching length M-LEN is counted up to "4".

As illustrated in FIG. 13E, next, character data of the final character "C" is held in the frame buffer 56. Only the match line of the address "4" becomes high, and a comparison is made whose results are "not matching", and as illustrated in FIG. 13F, the signal FOUND changes to low. At this time, the matching length M-LEN held in the data output controller 138 is "4" (i.e., greater than or equal to "2"). Therefore, the held character string is replaced by the compression code A and the compression code B.

Specifically, the address S-ADR held in the data output controller 138 is "4", and the matching length M-LEN which represents the matching length is "4". Therefore, in the character string which has already been fed out as the compressed character string data COMP-DATA, the beginning position of the character string which is the same as the repeat character string is S-ADR−M-LEN=0. As illustrated in FIG. 13F, the compression code A (represented by "(0)" in the figure), which represents the beginning position "0" of the character string, is fed out. Subsequently, as illustrated in FIG. 13G, the compression code B (represented by "(4)" in the figure), which represents the length "4" of the repeat character string, is fed out.

Next, as illustrated in FIG. 13H, the character data of "C" held in the write buffer 56 is sent from the data output controller 138 and is written to the address "6" of the associative memory cell array 26. The matching length M-LEN is reset to "0", and compression processing is thereby completed.

As is clear from the above-described operations, when, for example, the character string to be compressed is "ABABABCA", in addition to the above operations, the character "A" is sent to the write buffer 56 and a comparison operation is effected. Even if the length of the character string to be compressed varies, only the number of times the comparison operation is repeated varies, and compression of the character string to be compressed can be effected in an extremely short and fixed processing time. Also, even if the length of the character string to be compressed is very large and the amount of data thereof is greater than the storage capacity of the associative memory cell array 26, as in the present embodiment, when the write address arrives at the final address of the associative memory cell array 26, the write address may be returned to "0", and character data may be written by using the associative memory cell array 26 as a ring buffer. There is no need to use an associative memory cell array having a large storage capacity.

Further, it is preferable from the standpoint of the data compression rate as well that the storage capacity of the associative memory cell array 26 be not overly large. If the storage capacity of the associative memory cell array 26 is large, the amount of data which can be stored at one time is large. Therefore, the probability that a "matching" comparison result is realized in the comparison operation increases. However, if the storage capacity is too large, the number of bits for expressing the address MATCH-ADDRESS is also large, therefore, the number of bits of compression code A increases, and the compression rate decreases.

According to the present invention, if, for example, the storage capacity of the associative memory cell row is one byte, 12 bits are allocated for an address, and an appropriate storage capacity of the associative memory cell array 26 is about 2^12=4096 bytes. Further, because one character is represented by two bytes in Japanese text, when Japanese text is compressed, it is efficient for the storage capacity of the associative memory cell row to be 2 bytes. In this case, if the storage capacity of the associative memory cell array 26 is 4096 as described above, an address can be expressed by 11 bits.

Next, still another example of the present invention will be described. Parts which are the same as those previously described are denoted by the same reference numerals, and description thereof is omitted.

In the data input controller 138 relating to this example, when the level of the signal FOUND after the previous comparison operation is high and the signal FOUND changes to low, after this comparison operation, the character data from the data input controller 136 is stopped, and a control signal prohibiting the output of the write designation WRITE to the character string search device 20 is sent to the data input controller 136. In this way, comparison of the character data stored in all of the associative memory cell rows with respect to the character data held in the write buffer 56 is achieved.

Figure 14:
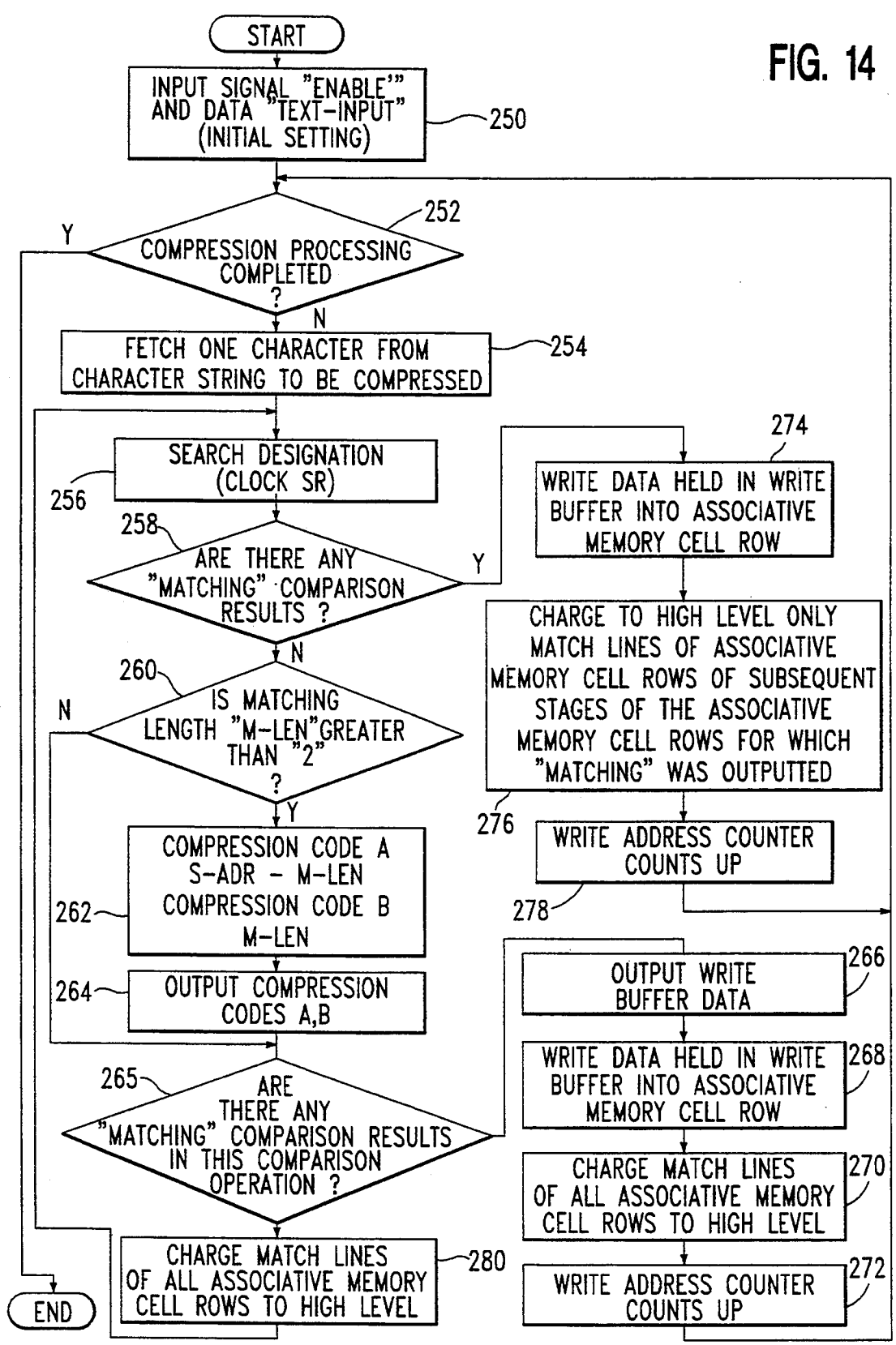
FIG. 14 is a flowchart explaining operation of a still another variation of the invention.

Compression processing of this example will now be described with reference to the flowchart in FIG. 14. When there are no associative memory cell rows whose comparison results of this comparison operation are "matching", the answer to the determination in step 258 is "No". After the answer to the determination in step 260 is "No" or after the answer to the determination in step 260 is "Yes" and the processes of step 262 and step 264 have been carried out, in step 265, a determination is effected at the data output controller 138 as to whether there are any associative memory cell rows whose comparison results of this comparison operation are "matching". Specifically, this determination can be made by determining whether the matching length M-LEN is greater than or equal to "1".

When there are no associative memory cell rows whose comparison results of this comparison operation are "matching" and the answer to the determination in step 265 is "No", in this comparison operation, comparison of the character data stored in all of the associative memory cell rows to the character data held in the write buffer 56 is being effected. Therefore, as described previously, the processes of steps 266 through 272 are effected, and the process returns to step 252. If there are associative memory cells whose comparison results of the previous comparison operation were "matching", in this comparison operation, comparison of only the character data stored in specific associative memory cell rows to the character data held in the write buffer 56 is effected, and there is the possibility that the character data held in the write buffer 56 matches character data stored in associative memory cell rows for which comparison is not achieved in this comparison operation.

As a result, the data output controller 138 blocks the output of the character data received from the data input controller 136, and sends, to the data input controller 136, the control signal prohibiting the write designation WRITE to the character string search device 20. Accordingly, as shown in step 280, as there are associative memory cell rows whose comparison results of this comparison operation are "matching" and the signal FOUND changes to low and all of the match lines are charged high. Rewriting of the character data held in the write buffer 56 is not done, and the process returns to step 256. The search designation SEARCH is sent from the data input controller 136, and a comparison of the character data stored in all of the associative memory cell rows to the character data held in the write buffer 56 is accomplished.

Accordingly, even in a case in which there are adjacent repeat character string data, each of a length of two characters or more, in the character string data to be compressed TEXT-INPUT, all of the characters of these repeat character string data can be detected as repeat character string data, and all of the repeat character strings included in the character string data to be compressed TEXT-INPUT can be detected without there being any misses. Accordingly, the compression rate improves even in comparison to the compression processing of the immediately previous example.

In order to improve the compression rate even further, the number of bits for expressing an address may be varied appropriately in accordance with the length of the data written in the associative memory cell array. For example, if, as described above, the storage capacity of the associative memory cell row is one byte, the number of bits necessary for addressing until data of 256 bytes is written in the associative memory cell array is "8", and the number of bits necessary until data of 1024 bytes is written is "10". Therefore, by appropriately varying the number of bits for expressing an address in accordance with the length of the data written in the associate memory cell array, the compression rate can be improved.

In order to further improve the compression ratio, the number of bits of the code (compression code A) representing the pointer which indicates the position of the character string which is the same as the repeat character string, and the number of bits of the code (compression code B) which represents the length of the repeat character string may be varied appropriately in accordance with the length of the data written in the associative memory cell array. For example, if the storage capacity of an associative memory cell row is one byte, the number of bits necessary for addressing until data of 256 bytes is written in the associate memory cell array, i.e., the number of bits necessary to indicate the position of the character string which is the same as the repeat character string, is "8", and the number of bits necessary until data of 1024 bytes is written is "10". Further, the maximum value of the length of the repeat character string also is varied in accordance with the amount of data written in the associative memory cell array.

Accordingly, when the amount of data stored in the associative memory cell array is small, the number of bits of compression code A and compression code B can be made small. Therefore, when compression processing begins, the number of bits of compression code A and compression code B is small, and is then increased in accordance with the increase in the amount of data written into the associative memory cell array. In this way, the compression ratio of the character string data to be compressed TEXT-INPUT can be improved.

If the length of the repeat character string in the above description is "two characters" or more, the repeat character string can be replaced by a compression code. However, this reference value can be made even longer. The reason why the reference value is not "1 character" is that if one character is replaced by a compression code when only one character matches in the above description, a high compression rate cannot be obtained. Therefore, it is preferable that a length of two characters or more is used as the reference value.

If the character string data to be compressed is written to the associative memory cell rows in a descending order of the addresses (i.e., written from the end), it is preferable that the priority encoder 60 has as an output the highest address as the address MATCH-ADDRESS when a plurality of match lines are high.

The restoration of the compressed character string data COMP-DATA, to character string data to be compressed, can be effected by the character string compression controller 120 temporarily storing in the associative memory cells 28, the character string data already restored from the compressed data COMP-DATA, and by restoring the compressed character string data, which is continuous with the compressed character string data already restored to the character string data, to character string data to be compressed by using the stored character string data.

Figure 15:
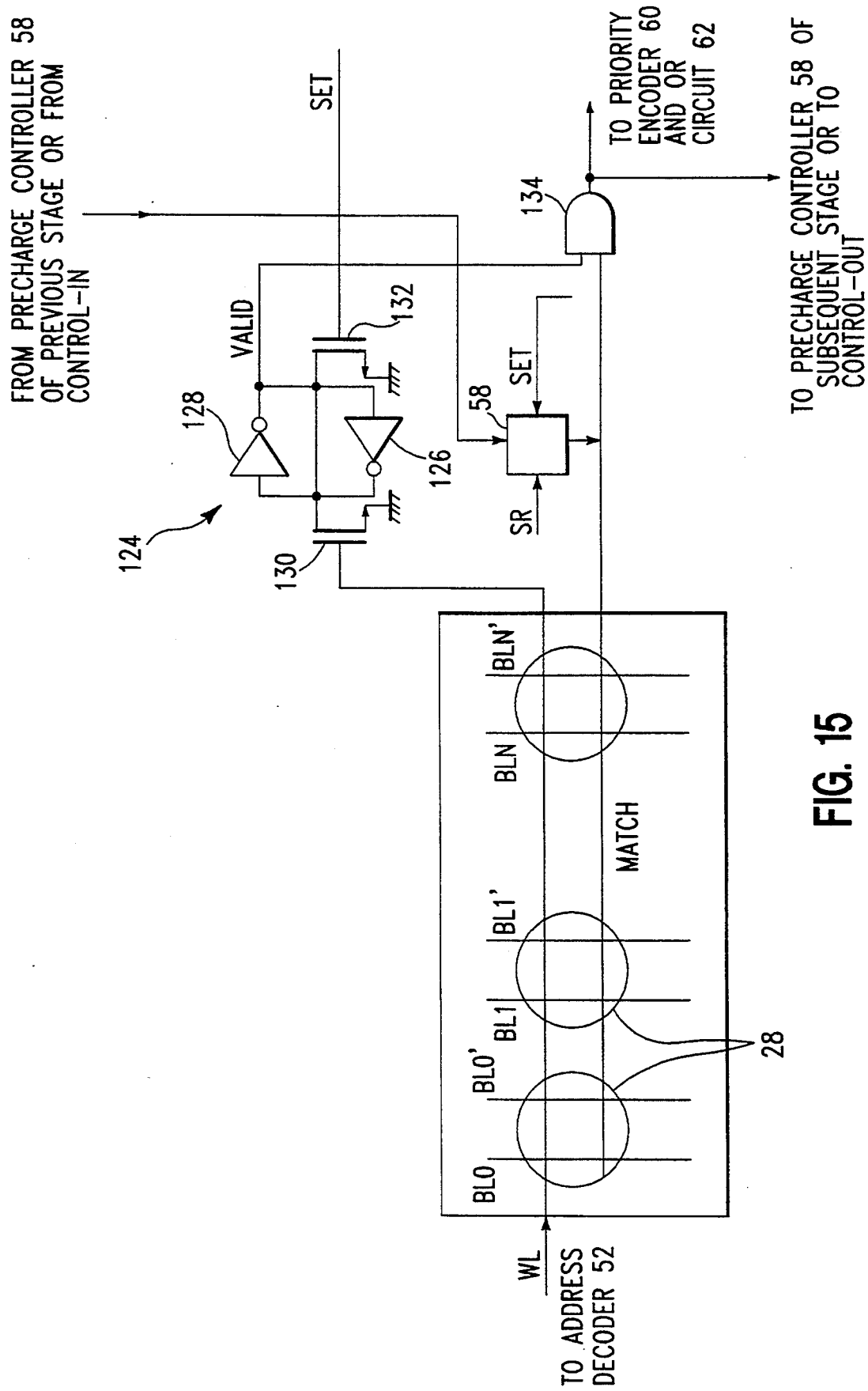
FIG. 15 is a block diagram illustrating a schematic structure of still another character string compression controller of the present invention.
Figure 16:
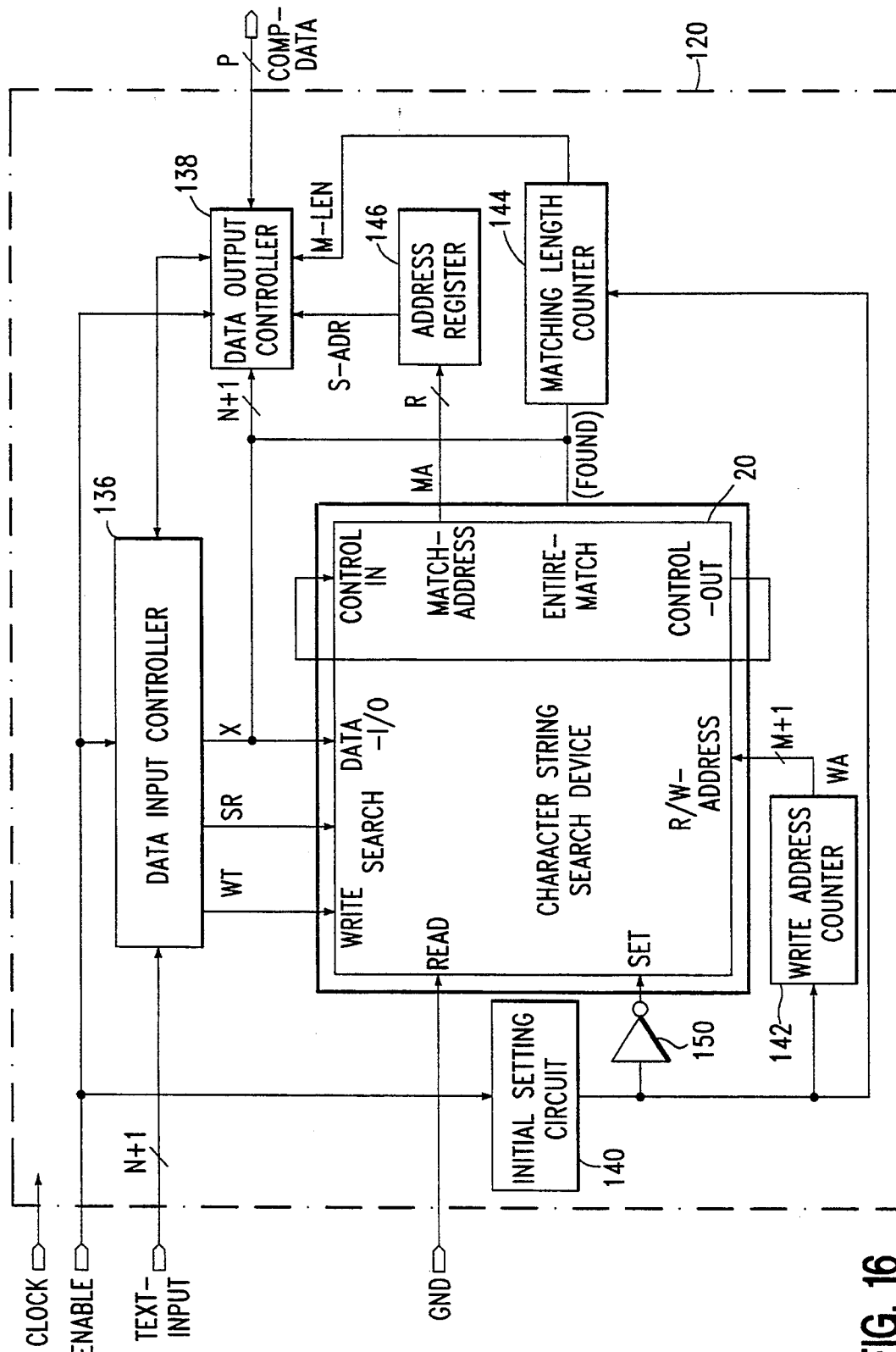
FIG. 16 is a circuit diagram illustrating a garbage control circuit added to a character string search circuit shown in FIG. 15.
Figure 17A:
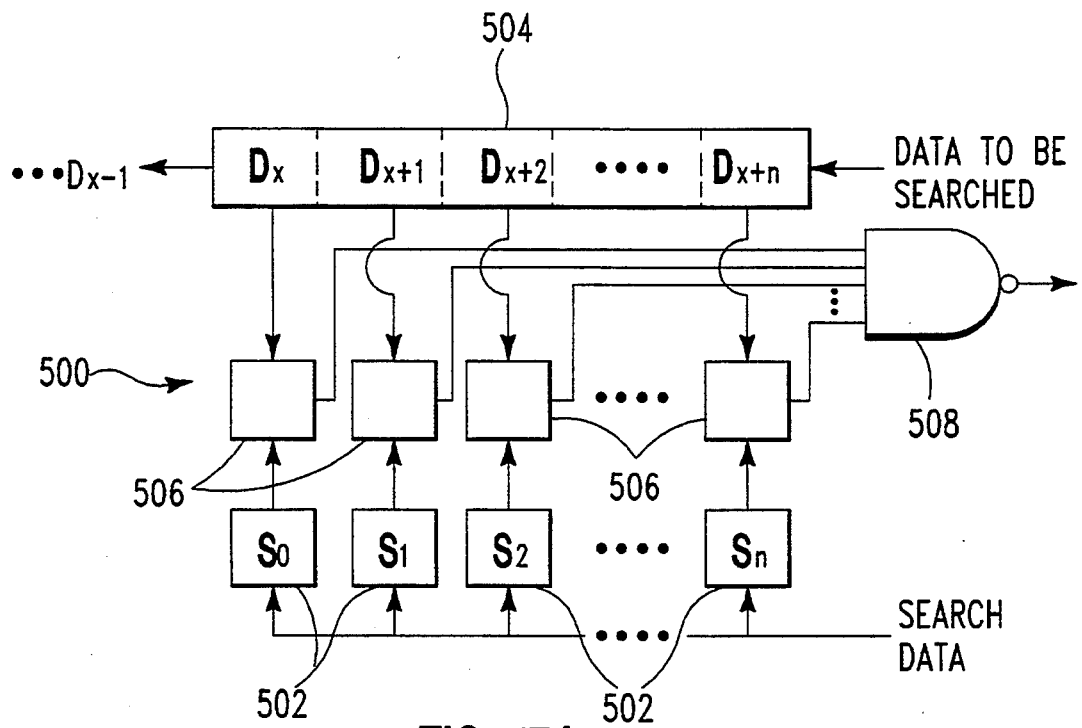
FIG. 17A is a schematic of a prior data search circuit.
Figure 17B:
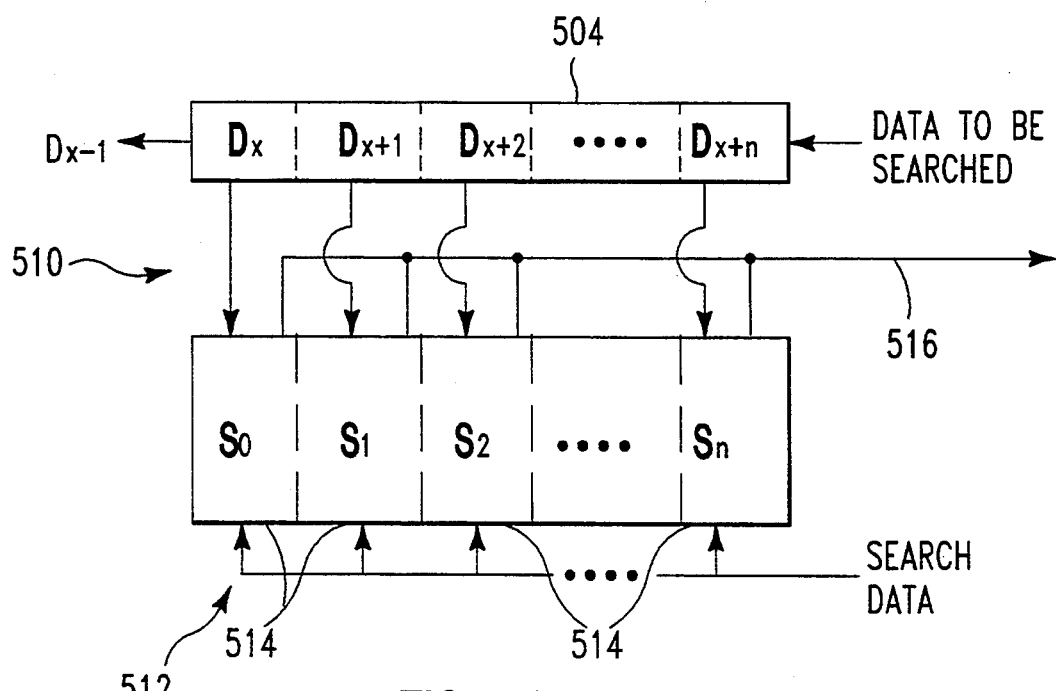
FIG. 17B is a block diagram illustrating a schematic structure of a search circuit in which a portion of the circuit in FIG. 17A has been replaced by an associative memory.

Now still another example of a variation of the present invention will be described. Parts which are the same as those previously described are denoted by the same reference numerals, and description thereof is omitted. In this example, as illustrated in FIG. 16, the overall garbage address controller 148 is omitted, the NAND circuit 150 is replaced by the NOT circuit 150a, and a garbage address circuit 124, illustrated in FIG. 15 is connected to each of the precharge controllers $58_O$ through $58_M$. Further, the matching length counter 144 is connected to the initial setting circuit 140. When a reset signal is sent from the initial setting circuit 140, the count value is reset to "0".

The garbage address control circuit 124, as shown in FIG. 5, is provided with a latch formed of two NOT circuits 126, 128 whose input terminals and output terminals are connected together. The output terminal of the NOT circuit 126 is connected to the input of NOT circuit 128 and to the drain of a MOSFET 130. The gate of the MOSFET 130 is connected to a word line WL, and the source is grounded. The output terminal of the NOT circuit 128 is connected to the input of the NOT circuit 126 and to the drain of a MOSFET 132. The gate of the MOSFET 132 is connected to the signal SET and its source is grounded.

The output terminal of the NOT circuit 128 is also connected to one of the two input terminals of an AND circuit 134 whose output is hereinafter called the signal VALID. The other input terminal of the AND circuit 134 is connected to a match line. The output terminal of the AND circuit 134 is bifurcated. One furcation is connected to the priority encoder 60 (see FIG. 2), and the other furcation is connected to the NOR circuit 70 of the precharge controller 58 (see FIG. 4).

When compression processing begins, the signal SET is sent to the character string search device 20, in each of the garbage address control circuits 124, and the MOSFET 132 is turned on. The input side of the NOT circuit 126 becomes low, and the output signal VALID goes low. This low state, of the signal VALID, is maintained by the NOT circuits 126, 128. Therefore, the results of the comparison operations at associative memory cell rows in which data is not written, i.e., in which stored data is undefined, do not effect the signal ENTIRE-MATCH nor the address MATCH-ADDRESS.

Further, when data is written to a specific associative memory cell row, the word line WL connected to the specific associative memory cell row becomes high. In this way, the MOSFET 130 of the garbage address control circuit 124 is turned on, the input side of the NOT circuit 128 becomes low, the output signal VALID becomes high, and this state (the high state of the signal VALID) is maintained by the NOT circuits 126, 128. Accordingly, even if all of the match lines are charged high, associative memory cell rows whose comparison results are sent to the priority encoder 60 and the OR circuit 62 are only the cell rows in which data is written. Comparison operations are substantially stopped for cell rows in which data is not written.

Methods of excluding comparison results from associative memory cell rows in which data is not written are not limited to the above-described methods of providing the garbage address controller 148 or providing the garbage address control circuits 124 for the respective precharge controllers 58. For example, in the initial setting, before compression and restoring of data, set data determined in advance can be stored each time in all of the associative memory cell rows of the associative memory cell array 26 so the "matching" comparison results from associative memory cell rows in which data is not written can be prevented.

The above description was explained by using character data as an example of data. However, the present invention is not limited to the same, and processing can be effected for various types of data such as image data, voice data, document data, execute form programs and the like.

Further, the priority encoder 60 may be structured such that when the match lines of a plurality of associative memory cell rows become high level, the priority encoder 60 outputs, as the address MATCH-ADDRESS, the address of the associative memory cell row, among the plurality of associative memory cell rows, in which character data has been written most recently.

Still further, the address register 146 may be structured so as to output, as the address S-ADR, the difference between the address MATCH-ADDRESS and the address R/W ADDRESS (i.e., the distance between the repeat character data and the same character data which has already appeared).

This may be realized by the following structure: the address R/W-ADDRESS, which is sent from the character string compression controller 120 to the address decoder 52 of the character string search device 20, is connected to a signal line so as to be sent to the priority encoder 60 and the address register 146 as well. On the basis of the address R/W-ADDRESS and the order of writing the character data (ascending order or descending order of the addresses), the priority encoder 60 determines the address of the associative memory cell row in which character data has most recently been written, among the addresses of the plurality of associative memory cell rows whose match lines have become high level. At the address register 146, the difference between the address MATCH-ADDRESS and the address R/W-ADDRESS is calculated and put out.

If the priority encoder 60 and the address register 146 are structured as described above, when a plurality of character strings which are the same as the repeat character string are detected, the address S-ADR sent from the address register 146 is data representing the distance between the repeat character string and the same character string having the minimum distance from the repeat character string, i.e., the minimum value of the respective distances between the repeat character string and the plurality of character strings which are the same as the repeat character string. The data output controller 138 calculates and outputs (S-ADR - M-REN) as the compression code A. If the data output controller 138 is structured such that the number of bits of the compression code A is varied in accordance with the value of the address S-ADR received from the address register 146, more specifically, if the data output controller 138 is structured such that if the value of the address S-ADR is small, the number of bits is decreased, and if the value of the address S-ADR is large, the number of bits is increased, the probability that data having a small number of bits will be put out as the compression code A increases. Therefore, the compression ratio of the character string data to be compressed TEXT-INPUT can be improved.

In the above description, compression processing is effected by an algorithm corresponding to LZ77. However, the present invention is not limited to the compression algorithm described above and can be made applicable to various compression algorithms necessary for searching.

SUMMARY

In summary, as described above, the invention sets forth a storing device, for storing a selected string of data, comprised of a plurality of storing means each of which for stores a specific unit of data in a predetermined order, e.g., either ascending or descending address, and corresponding comparing means that sends out a matching signal when a unit of data stored in the corresponding storing means matches received data, that is being searched.

In operation, a specific unit of data is fetched from search data and is fed to each of the plurality of comparing means which compares the received data to the stored data. Any comparing means which finds a match provides a specified output.

Thereafter, a new specific unit of data is fetched but is sent to only those comparing means which are adjacent to the comparing means which previously found a match. These operations are repeated until the all the search data has been compared. In this way at a search can be effected at high speed.

When a matching signal is no longer put out from the comparing means, the stored string is replaced by a predetermined code and appears as compressed data.

What is claimed is;

1. A data search device comprising:
   a source of data to be searched;
   a plurality of storage means coupled to the source of data, each of said storage means storing a respective selected unit of data, each of said storage means having an output;
   a plurality of comparing means, equal in number to said storage means, each of said comparing means being coupled to the output of a respective one of said storage means, each of said comparing means having an input coupled to said source of data to be searched;
   control means for fetching a first specific unit of search data from said source including means for transmitting said fetched, first specific unit of
search data to said comparing means;
a plurality of signal matching means respectively
coupled to a respective one of said comparing
means for putting out a first matching signal when
the stored selected unit of data, in a respective
storage means, matches the fetched, first specific
unit of search data;
means for storing said first matching signal from said
comparing means; and
means for directing said control means to fetch a
second specific unit of search data from said source
and transmit said second specific unit of search data
to only those comparing means adjacent to the
comparing means which has put out said first
matching signal.

2. A data search device according to claim 1, wherein said selected unit of data stored, in said plurality of storing means, is stored in ascending order of addresses supplied to said plurality of storing means.

3. A data search device according to claim 1, wherein said selected unit of data stored, in said plurality of storing means, is stored in descending order of addresses supplied to said plurality of storing means.

4. The device of claim 1 wherein:
there is further provided additional means for compressing and storing said fetched data as a code.

5. The device of claim 4 wherein said control means is further provided with a counting means for counting the number of times a matching signal is sent from a selected comparing means.

6. The device of claim 5 wherein there is further provided:
invalidation control means, which when said matching signals are sent from a selected comparing means, on the basis of a boundary address between a region in which unit of data has been stored and a region in which unit of data has not been stored in said storing device and on the basis of an address of the storing means corresponding to said comparing means invalidates a matching signal, from said comparing means, when said storing means corresponding to said comparing means is included in said region in which said unit of data has not been stored.

7. The device of claim 5, wherein there is further provided:
holding means, corresponding in number to said storing means, for holding information expressing whether a unit of data fetched from said source has been stored in said storing means; and
invalidation control means, corresponding in number to said storing means, for invalidating, on the basis of information held by said holding means, said matching signal, from said comparing means, when a unit of data fetched from said original data has not been stored in said storing means.

8. The device of claim 7, wherein said control means further includes means for varying said code in accordance with the number of storing means.

9. A data search device comprising:
a source of data to be searched;
an associative memory cell array comprising a plurality of associative memory cells,
control means, including a timing controller, an address decoder, a sensing amplifier and a write buffer for fetching and transmitting a unit of search data from said source to the cells of said array;
A plurality of match lines each being coupled to a respective set of cells in said array for putting out a matching signal when the data stored in a respective set of cells matches the fetched unit of data; and
encoding means for storing a matching signal from said match lines means and directing said control means to fetch a second specific unit of data from said source and transmit said second specific unit of data to only those sets of cells adjacent to the set of cells which has put out said matching signal.

10. A data search and compression device comprising:
a source of data to be searched;
a number of storage means each of which stores a selected unit of data;
a plurality of comparing means, equal in number to said storage means, coupled to said storage means and having an input coupled to said source of data to be searched,
control means for fetching a unit of search data from said source including;
means for transmitting said fetched unit of search data to said comparing means;
a plurality of matching signal means, each respectively coupled to respective one of said comparing means, for putting out a matching signal when the stored unit of data, in a respective storage means, matches the fetched unit of search data;
means for storing a matching signal from said comparing means; and
means for directing said control means to fetch a second specific unit of search data from said source and transmit said second specific unit of search data to only those comparing means adjacent to the comparing means which have put out said matching signal and repeating said fetching and transmitting until all the units of search data have been fetched from said source.

11. A data search method, using a source of data to be searched coupled to a plurality of storing means each of which stores a respected selected unit of data and a plurality of comparing means, equal in number to the storage means, comprising the steps of:
providing a source of data to be searched;
fetching a first specific unit of search data from said source of data;
transmitting said fetched, first specific unit of search data to each of said plurality of comparing means;
determining if a matching signal is provided from said comparing means and putting out a first matching signal when the stored selected unit of data, in a respective storage means, matches the fetched, first specific unit of search data;
storing said first matching fetched signal from said comparing means in the order of the addresses given to the said storing means in which the matching signal was found; and
fetching a second unit of search data from said source of data, and transmitting said second specific unit of search data to only those comparing means adjacent to the comparing means which has put out said first matching signal.

12. A data compression method, using a storing device having a plurality of storage cells, each capable of comparing a stored unit of data of a predetermined bit length to an input unit of data and putting out a matching signal when the stored unit of data corresponds to the input unit of data, comprising the steps of:

fetching a first unit of search data from a data string, which is comprised of a predetermined number of units of data;

sending said first unit of search data to each of said plurality of cells;

comparing said first unit of search data to the units of data stored in each of said cells, and, when a comparison is made by a cell, providing a match output signal and storing said first fetched unit of search data in a storing means in order of the address of the comparing cell, fetching a second unit of search data from said data string;

sending said second unit of search data only to a plurality of cells adjacent to the cells which have put out said matching signal and comparing said second unit of search data to the units of data stored in said cells, and if a match is not found compressing and storing said second fetched unit of search data as compressed data in a storing means but if a match is found storing said second fetched unit of search data;

fetching a third unit of search data, adjacent to said second fetched unit of search data, from said string and sending said third unit of search data only to a plurality of cells adjacent to the cells which have previously put out said matching signal and comparing said third unit of search data to the units of data stored in said cells, and, if a match is not found, compressing and storing said third fetched unit of search data as compressed data in a storing means but, if a match is found, storing said third fetched unit of data; and repeating said aforementioned operations until all the data in said string has been searched.

* * * * *